US009837252B2

(12) United States Patent
Howald et al.

(10) Patent No.: US 9,837,252 B2
(45) Date of Patent: Dec. 5, 2017

(54) SYSTEMS AND METHODS FOR USING ONE OR MORE FIXTURES AND EFFICIENCY TO DETERMINE PARAMETERS OF A MATCH NETWORK MODEL

(71) Applicant: Lam Research Corporation, Fremont, CA (US)

(72) Inventors: Arthur M. Howald, Livermore, CA (US); John C. Valcore, Jr., Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/145,601

(22) Filed: May 3, 2016

(65) Prior Publication Data
US 2016/0322207 A1 Nov. 3, 2016

Related U.S. Application Data

(63) Continuation-in-part of application No. 14/716,797, filed on May 19, 2015, and a continuation-in-part of application No. 14/245,803, filed on Apr. 4, 2014, application No. 15/145,601, which is a continuation-in-part of application No. 15/059,778, filed on Mar. 3, 2016.

(60) Provisional application No. 61/821,523, filed on May 9, 2013.

(51) Int. Cl.
*H01J 37/32* (2006.01)
*G01R 27/28* (2006.01)

(52) U.S. Cl.
CPC .. *H01J 37/32926* (2013.01); *H01J 37/32183* (2013.01)

(58) Field of Classification Search
CPC .................. H01J 37/32926; H01J 37/32183
See application file for complete search history.

(56) References Cited

U.S. PATENT DOCUMENTS

| | | | | |
|---|---|---|---|---|
| 2004/0061448 A1* | 4/2004 | Avoyan | ............. | H01J 37/32935 315/111.21 |
| 2008/0284537 A1* | 11/2008 | Ikenouchi | ................ | H03H 7/40 333/17.3 |
| 2009/0284156 A1* | 11/2009 | Banna | .................. | H01J 37/321 315/111.21 |

* cited by examiner

*Primary Examiner* — Patrick Assouad
*Assistant Examiner* — Haidong Zhang
(74) *Attorney, Agent, or Firm* — Martine Penilla Group, LLP

(57) ABSTRACT

Systems and methods for using multiple one or more fixtures and efficiency to determine fixed parameters of a match network model are described. A value of efficiency that is measured using a network analyzer and a value of predicted efficiency that is determined using the match network model are compared. The comparison is made to determine whether the fixed parameters are to be assigned to the match network model.

18 Claims, 13 Drawing Sheets

SYSTEMS AND METHODS FOR USING ONE OR MORE FIXTURES AND EFFICIENCY TO DETERMINE PARAMETERS OF A MATCH NETWORK MODEL

CLAIM OF PRIORITY

This application is a continuation-in-part of and claims the benefit, under 35 U.S.C. §120, of co-pending U.S. patent application Ser. No. 14/716,797, filed on May 19, 2015, and titled "SYSTEMS AND METHODS FOR PROVIDING CHARACTERISTICS OF AN IMPEDANCE MATCHING MODEL FOR USE WITH MATCHING NETWORKS", which is incorporated by reference herein in its entirety.

This application is a continuation-in-part of and claims the benefit, under 35 U.S.C. §120, of co-pending U.S. patent application Ser. No. 14/245,803, filed on Apr. 4, 2014, and titled "SEGMENTING A MODEL WITHIN A PLASMA SYSTEM", which claims priority, under 35 U.S.C. §119(e) from U.S. Provisional Patent Application No. 61/821,523, filed on May 9, 2013 and titled "SEGMENTING A MODEL WITHIN A PLASMA SYSTEM", both of which are incorporated by reference herein in their entirety.

This application is a continuation-in-part of and claims the benefit, under 35 U.S.C. §120, of co-pending U.S. patent application Ser. No. 15/059,778, filed on Mar. 3, 2016, and titled "SYSTEMS AND METHODS FOR USING MULTIPLE INDUCTIVE AND CAPACITIVE FIXTURES FOR APPLYING A VARIETY OF PLASMA CONDITIONS TO DETERMINE A MATCH NETWORK MODEL", which is incorporated by reference herein in its entirety.

FIELD

The present embodiments relate to systems and methods for using one or more fixtures and efficiency to determine parameters of a match network model.

BACKGROUND

Plasma systems are used to control plasma processes. A plasma system includes multiple radio frequency (RF) sources, an impedance match, and a plasma reactor. A workpiece is placed inside the plasma chamber and plasma is generated within the plasma chamber to process the workpiece. It is important that the workpiece be processed in a similar or uniform manner independent of replacement or use of one part of the plasma system with another. For example, when a part of the plasma system is replaced with another part, the workpiece is processed differently.

It is in this context that embodiments described in the present disclosure arise.

SUMMARY

Embodiments of the disclosure provide apparatus, methods and computer programs for using one or more fixtures and efficiency to determine parameters of a match network model. It should be appreciated that the present embodiments can be implemented in numerous ways, e.g., a process, an apparatus, a system, a piece of hardware, or a method on a computer-readable medium. Several embodiments are described below.

A radio frequency (RF) match network model is a mathematical representation or a computer representation of a physical impedance matching network and is used to predict RF properties, e.g., current, voltage, and phase, etc., at an output of the impedance matching network from measurement of the RF properties at an input of the impedance matching network. As a starting point, the match network model has a modular form including various modules. Examples of the modules are provided in the patent application having application Ser. No. 14/245,803. Each module includes one or more circuit elements. Values of the circuit elements in the modules are based on known values of inductance and capacitance from a schematic of the impedance matching network and on approximations of some physical quantities, such as, an inductance of connecting straps that are not included in the schematic. The starting point of the match network model is improved by making a set of experimental measurements and adjusting the values of the circuit elements to provide a fit between the measurements and predictions of the match network model. One way to obtain the experimental measurements is to use wafers in a plasma tool. During an on-tool measurement, a high-accuracy RF voltage and current probe is temporarily installed at the output of the impedance matching network implemented in the plasma tool to run a variety of plasma recipes and record measured RF voltage and current at the output of the impedance matching network for each recipe, and vary the values of the circuit elements in the modules of the match network model to provide a fit between the measurements and the predictions.

However, the on-tool measurement is time-consuming in that tool time of using the plasma tool is occupied. By using the high-accuracy RF voltage and current probe, baseline values of the match network model are generated for each impedance matching network. However, each individual matching network, which has a specific serial number and a model number, is slightly different from any other individual matching network, which has another serial number and the same model number. The use of the high-accuracy RF voltage and current probe is performed on about a half dozen individual matching networks, which takes a few weeks.

Once a baseline match model exists, more accurate models for individual matching networks are made using bench network analyzer measurements obtained for each matching network. The measurements are obtained by attaching a physical test fixture, sometimes referred to herein as a load impedance fixture, to an output of the impedance matching network under test and by using the network analyzer to obtain a measurement at an input of the impedance matching network. The load impedance fixture is designed to have an impedance the same as one of multiple plasma conditions so the measurement by the network analyzer mimics one of many on-tool tests. The match network model is adjusted for the impedance matching network based on the measurement obtained using the load impedance fixture to generate a result more accurate than if the baseline model was applied for the impedance matching network.

It should be noted that a plasma impedance changes with a number of RF generators of various frequencies, e.g., 2 megahertz (MHz), 27 MHz, 60 MHz, 400 kilohertz (kHz), etc. That is, in some embodiments, for a multi-frequency plasma system in which two or more of the 400 kHz, 2 MHz, 27 MHz, and 60 MHz RF generators are used, an impedance of plasma is different at the different frequencies of the RF generators.

In various embodiments, different load impedance fixtures are used for different frequencies. For example, a first load impedance fixture is used for 2 MHz, a second load impedance fixture is used for 27 MHz, and a $3^{rd}$ load impedance fixture is used for 60 MHz.

In some embodiments, a set of multiple bench-top fixtures, sometimes referred to herein as load impedance fixtures, are used to mimic a multiple number of on-tool plasma conditions to obtain multiple network analyzer measurements. The multiple network analyzer measurements with the multiple bench-top fixtures are used to create the baseline values of the match network model without having to run wafers on the plasma tool with plasma, which saves time associated with use of the on-line tool and resources of the on-line tool. The multiple bench-top fixtures are inexpensive. The multiple bench-top fixtures are built from a combination of a resistor, or a capacitor, or an inductor, or a cable, or a combination of two or more thereof. For example, one of the fixtures includes a resistor and a variable length coaxial cable. Each of the multiple bench-top fixtures is connected to the output of the impedance matching network consecutively, and network analyzer measurements associated with the input of the matching network at one or more values of a combined variable capacitance of the impedance matching network and an RF frequency are obtained. Values of the circuit elements of the match network model are optimized to obtain an agreement between the network analyzer measurements and predicted values generated from the network analyzer measurements without using plasma.

In various embodiments, an efficiency is measured using a load impedance fixture and a network analyzer, and an efficiency is predicted using the match network model, and an agreement is obtained between the measured efficiency and the predicted efficiency to determine parameters of the match network model. The use of the efficiencies provides an accurate determination of the parameters. Moreover, as explained above, there is no use of the plasma tool, e.g., a plasma chamber, etc., in calculating the efficiencies. Such non-use of the plasma tool saves the tool time.

In some embodiments, an agreement between impedances measured using the multiple bench-top fixtures and impedances predicted using the match network model, and an agreement between the measured efficiency and the predicted efficiency are obtained to calculate the parameters. The use of the efficiencies and the impedances results in an accurate determination of the parameters.

Some advantages of the herein described systems and methods include that the match network model is created and checked on a test bench, without having to use wafers and tool time. Additional advantages of the herein described systems and methods include covering a wide range of plasma conditions using the multiple fixtures than that covered using actual different recipes in the plasma tool. The match network model, when created using the plasma tool, is accurate for a range of variable capacitances of the impedance matching network and RF frequencies for which test wafers are processed. When a new process in the future uses a different variable capacitance or a different RF frequency, the match network model will not be as accurate for the different variable capacitance and the different RF frequency. By using the multiple fixtures, a wide range of plasma conditions are mimicked, and therefore the match network model is generated to be used with a large range of plasma conditions. Also, the multiple fixtures are relatively inexpensive to fabricate.

Additional advantages include using the measured efficiency and the predicted efficiency to determine the parameters of the match network model. The use of the efficiencies results in an accurate determination of the parameters.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

DETAILED DESCRIPTION

The following embodiments describe systems and methods for using one or more fixtures and efficiency to determine parameters of a match network model. It will be apparent that the present embodiments may be practiced without some or all of these specific details. In other instances, well known process operations have not been described in detail in order not to unnecessarily obscure the present embodiments.

In various embodiments, an efficiency is measured using a network analyzer and an efficiency is predicted using the match network model. It is determined whether there is a level of agreement between the measured efficiency and the predicted efficiency. Upon determining that the agreement exists, parameters based on which the predicted efficiency is determined are assigned to the match network model. Otherwise, the parameters are changed until the agreement is reached. The changed parameters are then assigned to the match network model.

Figure 1A:
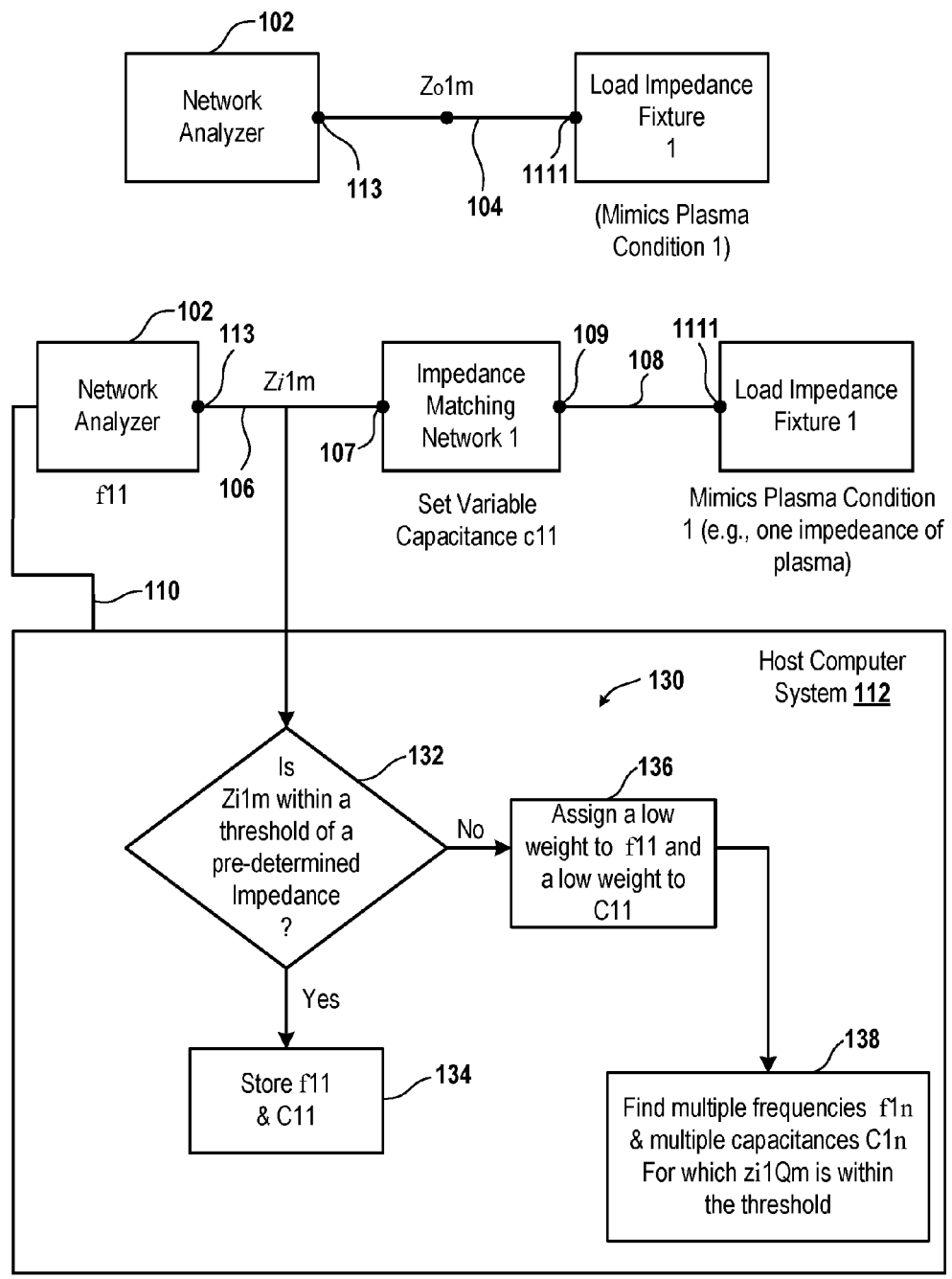
FIG. 1A is a diagram to illustrate determination of one or more variable frequencies of a network analyzer connected to a load impedance fixture 1 and determination of one or more variable capacitances of an impedance matching network for use of the one or more variable frequencies and the one or more variable capacitances in a match network model.

FIG. 1A is a diagram to illustrate a determination of one or more variable frequencies of a network analyzer 102 connected to a load impedance fixture 1 and of one or more variable capacitances of an impedance matching network 1 for use of the one or more variable frequencies and the one or more variable capacitances in the match network model. In some embodiments, the network analyzer 102 is a measurement device for measuring s-parameters of electrical networks that are connected to the network analyzer 102. For example, the network analyzer 102 measures reflection and transmission parameters, e.g., impedance, reflection coefficient, voltage standing wave ratio, etc., of the electrical networks.

In several embodiments, a network analyzer, as used herein, includes a signal generator, one or more sensors, and a display screen. The signal generator generates an radio frequency (RF) signal, the one or more sensors sense an s-parameter, and the display screen displays the s-parameter.

The network analyzer 102 is connected at its output 113 to an input 1111 of the load impedance fixture 1 via an RF cable 104. The load impedance fixture 1 has an impedance that represents a plasma condition, e.g., an impedance within a plasma chamber, etc. The network analyzer 102 generates the RF signal having a frequency f11 and provides the RF signal to the load impedance fixture 1 via the output 113, the RF cable 104, and the input 1111. When the RF signal having the frequency f11 is provided to the load impedance fixture 1, a load impedance Zo1$m$ is measured at the input 1111 of the load impedance fixture 1.

The network analyzer 102 is disconnected from the load impedance fixture 1 and then connected at its output 113 to an input 107 of a branch circuit of an impedance matching network 1 via a radio frequency (RF) cable 106. For example, the branch circuit is to be connected to an x megahertz (MHz) RF generator or to a y MHz RF generator or to a z MHz RF generator during processing of a wafer. The branch circuit is one of multiple branch circuits in case multiple RF generators are used. For example, when x and y MHz RF generators are used, two branch circuits are implemented within the impedance matching network 1. One of the two branch circuits has an input that is connected to an output of the x MHz RF generator and another one of the two branch circuits has an input connected to an output of the y MHz RF generator. Outputs of the two branch circuits are connected with each other and are to be connected to an RF transmission line or to a load impedance fixture. In some embodiments, an example of the x MHz RF generator includes a 2 MHz RF generator, an example of the y MHz RF generator includes a 27 MHz RF generator, and an example of the z MHz RF generator includes a 60 MHz RF generator. In various embodiments, an example of the x MHz RF generator includes a 400 kilohertz (kHz) RF generator, an example of the y MHz RF generator includes a 27 MHz RF generator, and an example of the z MHz RF generator includes a 60 MHz RF generator.

Each branch circuit of the impedance matching network 1 includes one or more inductors, or one or more capacitors, or one or more resistors, or a combination thereof. For example, a branch circuit of the impedance matching network 1 includes a series circuit that includes an inductor coupled in series with a capacitor. The branch circuit of the impedance matching network 1 further includes a shunt circuit connected to the series circuit. The shunt circuit includes a capacitor connected in series with an inductor. The branch circuit of the impedance matching network 1 includes one or more capacitors and corresponding capacitances of the one or more capacitors are variable, e.g., are varied using a drive assembly, etc., during processing of the wafer. For example, a processor of a host computer system 112 sends a signal to the drive assembly to change a position of one or both plates of a variable capacitor of the impedance matching network 1 to change an area between the two plates to further change a capacitance of the variable capacitor to achieve a capacitance. A combined variable capacitance of the one or more variable capacitors of the impedance matching network 1 is set to a value C11. For example, positions of corresponding oppositely-located plates of the one or more variable capacitors are adjusted to set the variable capacitance C11. To illustrate, the combined capacitance of two or more capacitors that are connected to each other in parallel is a sum of capacitances of the capacitors. As another illustration, the combined capacitance of two or more capacitors that are connected to each other in series is an inverse of a sum of inverses of capacitances of the capacitors. As yet another illustration, the processor of the host computer system 112 controls the drive assembly, further described below, to move plates of a variable capacitor of the impedance matching network 1 to achieve the capacitance C11. An example of an impedance matching network 1 is provided in patent application having application Ser. No. 14/716,797.

The impedance matching network 1 is also connected at its output 109, which is an output of the branch circuit, to an input 1111 of a load impedance fixture 1 via an RF cable 108. The branch circuit is connected at the input 107 to the output 113. Moreover, the combined variable capacitance of the impedance matching network 1 is set to the value C11. The load impedance fixture 1 has an impedance that represents a plasma condition, e.g., an impedance within a plasma chamber, etc. The network analyzer 102 generates an RF signal having the frequency f11 and provides the RF signal to the impedance matching network 1 via the output 113, the RF cable 106, and the input 107. The impedance matching network 1 matches an impedance of a load connected to the impedance matching network 1 with that of a source connected to the impedance matching network 1 to generate a modified signal, which is an RF signal. Examples of the load include the load impedance fixture 1 and the RF cable 108, and of the source include the network analyzer 102 and the RF cable 106. The modified signal is provided from the impedance matching network 1 to the load impedance fixture 1 via the output 109 and the input 1111. When the RF signal is supplied by the network analyzer 102 via the RF cable 106 to the impedance matching network 1 that has the combined variable capacitance C11, an input impedance Zi1$m$ at the input 107 of the impedance matching network 1 is measured by the network analyzer 102. An impedance, as used herein, is a complex value. For example, an impedance Z is a complex value R+jX, where R is a resistance, X is a reactance, and j is a complex number.

The network analyzer 102 is connected via a network cable 110 to the host computer system 112, which includes the processor and a memory device. Examples of the host computer system 112 include a laptop computer or a desktop computer or a tablet or a smart phone, etc. As used herein, instead of the processor, a central processing unit (CPU), a controller, an application specific integrated circuit (ASIC), or a programmable logic device (PLD) is used, and these terms are used interchangeably herein. Examples of a memory device include a read-only memory (ROM), a random access memory (RAM), a hard disk, a volatile memory, a non-volatile memory, a redundant array of storage disks, a Flash memory, etc. Examples of a network cable, as used herein, is a cable used to transfer data in a serial manner, or in a parallel manner, or using a Universal Serial Bus (USB) protocol, etc.

The processor of the host computer system 112 receives the measured input impedance Zi1m from the network analyzer 102 via the network cable 110. The processor determines, in an operation 132 of a method 130, whether the measured input impedance Zi1m is within a pre-determined threshold of a pre-determined impedance, e.g., 50 ohms, 55 ohms, 60 ohms, an impedance between 45 and 50 ohms, etc. In some embodiments, the pre-determined threshold and the pre-determined impedance are received as an input by the processor from a user via an input device, which is further described below, and stored by the processor within the memory device of the host computer system 112. In some embodiments, the pre-determined threshold and the pre-determined impedance are received by the processor before a time at which an input impedance, e.g., Zi1m, etc., is measured by the network analyzer 102. Upon determining that the measured input impedance Zi1m is within the pre-determined threshold of the pre-determined impedance, the processor stores, in an operation 134 of the method 130, the frequency f11 and the variable capacitance C11 within the memory device of the host computer system 112.

On the other hand, upon determining that the measured input impedance Zi1m is not within the pre-determined threshold of the pre-determined impedance, the processor determines, in an operation 136 of the method 130, to assign a pre-determined weight to the frequency f11 and assign a pre-determined weight to the variable capacitance C11. For example, the pre-determined weight is assigned by the processor to the frequency f11 to generate a weighted frequency fw11 and the pre-determined weight is assigned by the processor to the variable capacitance C11 to generate a weighted capacitance Cw11, and a sum Sf1 of the weighted frequency fw11 and another weighted frequency fww11 and a sum Sc1 of the weighted capacitance Cw11 and another weighted capacitance Cww11 are generated and used by the processor below. A lower amount of weight is assigned to the capacitance C11 than to another capacitance Co11 and a lower amount of weight is assigned to the frequency f11 compared to another frequency fo11. The other weighted capacitance Cww11 is generated by the processor by assigning a weight to the other capacitance Co11 and the other weighted frequency fww11 is generated by the processor by assigning a weight to the other frequency fo11. The other frequency fo11 and the other weighted capacitance Co11 are ones for which a measured impedance at the input 107 of the impedance matching network 1 is within the threshold of the pre-determined impedance. As another example, a weight of zero is assigned to the variable capacitance C11 and a weight of 0 is assigned to the frequency f11. As yet another example, the variable capacitance C11 and the frequency f11 are not stored within the memory device of the host computer system 112 for later use.

Upon assigning the pre-determined weight to the frequency f11 and assigning the pre-determined weight to the variable capacitance C11, an operation 138 of the method 130 is performed. For example, a frequency of the RF signal generated by the network analyzer 102 is modified, e.g., from f11 to f12, f12 to f13, etc., and/or a variable combined capacitance of the impedance matching network 1 is modified, e.g., from C11 to C12, from C12 to C13, etc., so that an input impedance Zi1Qm, measured at the input 107 of the impedance matching network 1, is within the pre-determined threshold of the pre-determined impedance, where Q is an integer greater than zero. For example, the network analyzer 1 changes a frequency of the RF signal from f11 to f12, and the variable capacitance C11 is not changed. The input impedance Zi1Qm measured by the network analyzer 102 is within the pre-determined threshold of the pre-determined impedance. The processor stores the frequency f12 and the variable capacitance C11 within the memory device. As another example, the variable capacitance C11 of the impedance matching network 1 is changed from C11 to C12. For example, the drive assembly controls plates of a variable capacitor of the impedance matching network 1 to modify the variable capacitance of the variable capacitor so that the combined variable capacitance of all variable capacitors of the impedance matching network 1 is C12. When the network analyzer supplies the RF signal having the frequency f11 to the impedance matching network 1, the network analyzer measures the impedance Zi1Qm at the input 107 of the impedance matching network 1 and the processor determines that the impedance Zi1Qm is within the pre-determined threshold from the pre-determined impedance. The frequency f11 and the variable capacitance C12 are stored in the memory device. In this manner, multiple frequencies f1n and multiple capacitances C1n are calculated and stored in the memory device, where n is an integer greater than zero, for which the impedance Zi1Qm is within the pre-determined threshold.

Figure 1B:
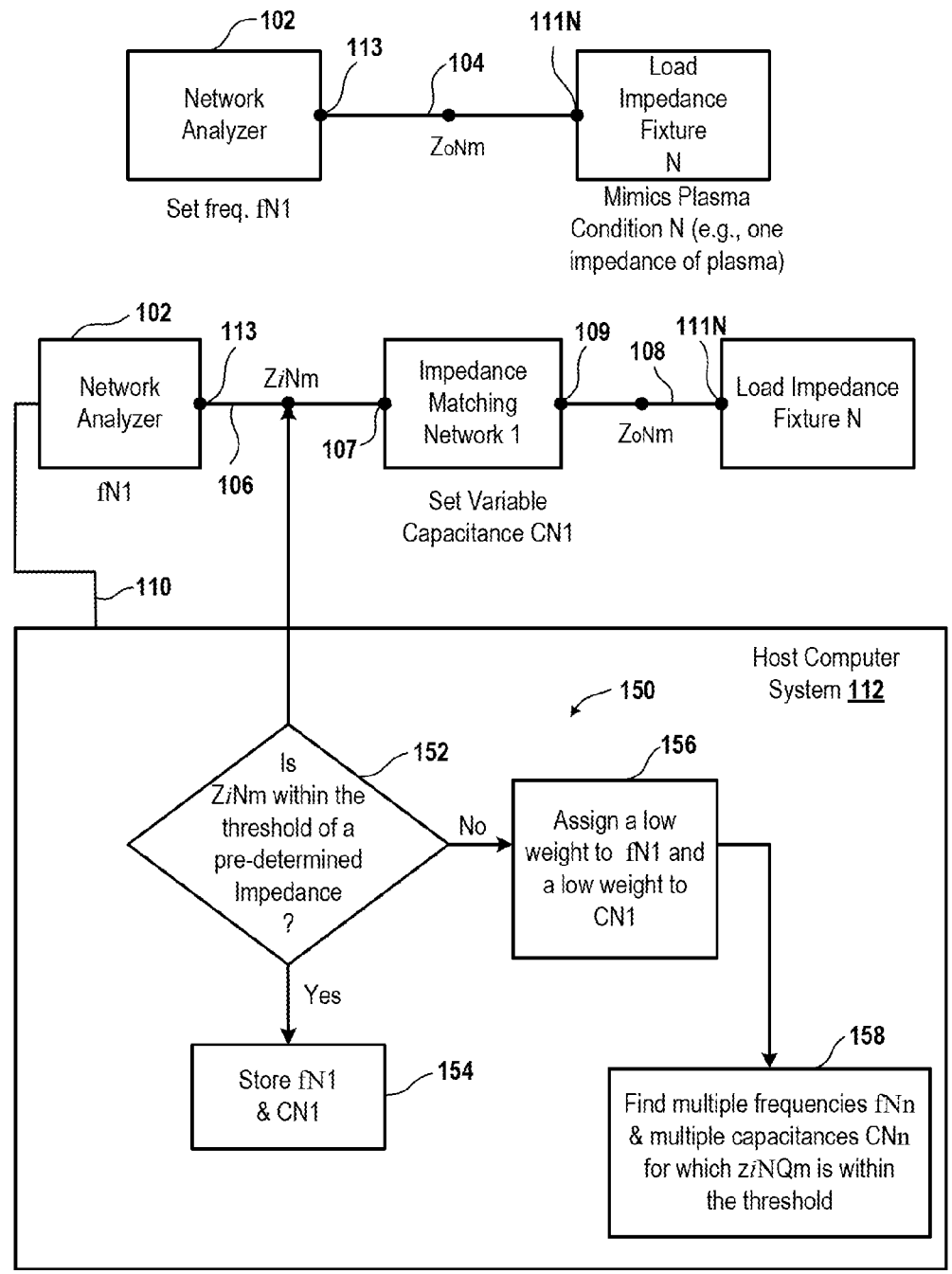
FIG. 1B is a diagram to illustrate determination of one or more variable frequencies of the network analyzer that is connected to a load impedance fixture N and determination of one or more variable capacitances of the impedance matching network for use of the one or more variable frequencies and the one or more variable capacitances in the match network model.

FIG. 1B is a diagram to illustrate determination of one or more variable frequencies of the network analyzer 102 that is connected to a load impedance fixture N and of one or more variable capacitances of the impedance matching network 1 for use of the one or more variable frequencies and the one or more variable capacitances in the match network model, where N is an integer greater than 1. The network analyzer 102 is disconnected from the load impedance fixture 1 and connected at its output 113 to an input 111N of the load impedance fixture N via the RF cable 104. The load impedance fixture N has an impedance that represents a plasma condition and the plasma condition is different from the plasma condition represented by the load impedance fixture 1. For example, the load impedance fixture N has a different impedance than an impedance of the load impedance fixture 1. The network analyzer 102 generates an RF signal having a frequency fN1 and provides the RF signal to the load impedance fixture N via the output 113, the RF cable 104, and the input 111N. When the RF signal is provided to the load impedance fixture N, a load impedance ZoNm is measured at the input 111N of the load impedance fixture N.

It should be noted that the values Zo1m and ZoNm are not constant values. For example, the value Zo1m changes with an RF frequency of operation of the load impedance fixture 1 and the value ZoNm changes with an RF frequency of operation of the load impedance fixture N.

The network analyzer 102 is disconnected from the load impedance fixture 1 and is connected to the input 107 of the branch circuit of the impedance matching network 1 via the RF cable 106, and the output 109 of the branch circuit is connected to the input 111N of the load impedance fixture N via the RF cable 108. The load impedance fixture N has an impedance that represents a plasma condition and the plasma condition is different from the plasma condition represented by the load impedance fixture 1. For example, the load impedance fixture N has a different impedance than an impedance of the load impedance fixture 1.

A combined variable capacitance of the one or more variable capacitors of the impedance matching network 1 is adjusted via the drive assembly to achieve a value CN1. The network analyzer 102 generates an RF signal having the frequency fN1 and provides the RF signal via the output 113 and the input 107 to the impedance matching network 1 via the RF cable 106. The impedance matching network 1 matches an impedance of a load connected to the impedance matching network 1 with that of a source connected to the impedance matching network 1 to generate a modified signal, which is an RF signal. Examples of the load include the load impedance fixture N and the RF cable 108, and of the source include the network analyzer 102 and the RF cable 106. The modified signal is provided from the impedance matching network 1 via the output 109, the RF cable 108, and the input 111N to the load impedance fixture N. When the RF signal having the frequency fN1 is supplied by the network analyzer 102 via the RF cable 106 to the branch circuit of the impedance matching network 1 and the combined variable capacitance of the impedance matching network is CN1, an input impedance ZiNm is measured at the input 107 of the impedance matching network 1.

The processor of the host computer system 112 receives the measured input impedance ZiNm from the network analyzer 102 via the network cable 110. The processor determines, in an operation 152 of a method 150, whether the measured input impedance ZiNm is within the pre-determined threshold of the pre-determined impedance. Upon determining that the measured input impedance ZiNm is within the pre-determined threshold of the pre-determined impedance, the processor, in an operation 154 of the method 150, stores the frequency fN1 and the variable capacitance CN1 within the memory device of the host computer system.

On the other hand, upon determining that the measured input impedance ZiNm is not within the pre-determined threshold of the pre-determined impedance, the processor assigns, in an operation 156 of the method 150, a pre-determined weight to the frequency fN1 and a pre-determined weight to the variable capacitance CN1. For example, the processor assigns the pre-determined weight to the frequency fN1 to generate a weighted frequency fwN1 and assigns the pre-determined weight to the variable capacitance CN1 to generate a weighted capacitance CwN1, and a sum SfN of the weighted frequency fwN1 and another weighted frequency fwwN1 and a sum ScN of the weighted capacitance CwN1 and another weighted capacitance CwwN1 are generated and used by the processor below. A lower amount of weight is assigned to the capacitance CN1 than to another capacitance CoN1 and a lower amount of weight is assigned to the frequency fN1 compared to another frequency foN1. The other weighted capacitance CwwN1 is generated by the processor by assigning a weight to the other capacitance CoN1 and the other weighted frequency fwwN1 is generated by the processor by assigning a weight to the other frequency foN1. The other frequency foN1 and the other weighted capacitance CoN1 are ones for which a measured impedance at the input 107 of the impedance matching network 1 is within the threshold of the pre-determined impedance. As another example, a weight of zero is assigned to the variable capacitance CN1 and a weight of 0 is assigned to the frequency fN1. As yet another example, the variable capacitance CN1 and the frequency fN1 are not stored within the memory device of the host computer system 112 for later use.

Upon assigning the pre-determined weight to the frequency fN1 and assigning the pre-determined weight to the variable capacitance CN1, an operation 158 of the method 150 is performed. For example, a frequency of the RF signal generated by the network analyzer 102 is modified, e.g., from fN1 to fN2, fN2 to fN3, etc., and/or a variable combined capacitance of the impedance matching network 1 is modified, e.g., from CN1 to CN2, from CN2 to CN3, etc., so that an input impedance ZiNQm, measured at the input 107 of the impedance matching network 1, is within the pre-determined threshold of the pre-determined impedance. For example, the network analyzer 1 changes a frequency of the RF signal from fN1 to fN2, and the variable capacitance CN1 is not changed. The input impedance ZiNQm measured by the network analyzer 102 is within the pre-determined threshold of the pre-determined impedance. The processor stores the frequency fN2 and the variable capacitance CN1 within the memory device. As another example, the variable capacitance CN1 of the impedance matching network 1 is changed from CN1 to CN2. For example, the drive assembly controls plates of a variable capacitor of the impedance matching network 1 to modify the variable capacitance of the variable capacitor so that the combined variable capacitance of all variable capacitors of the impedance matching network 1 is CN2. When the network analyzer 102 supplies the RF signal having the frequency fN1 to the impedance matching network 1, the network analyzer 102 measures the impedance ZiNQm at the input 107 of the impedance matching network 1 and the processor determines that the impedance ZiNQm is within the pre-determined threshold from the pre-determined impedance. The frequency fN1 and the variable capacitance CN2 are stored in the memory device. In this manner, multiple frequencies fNn and multiple capacitances CNn are calculated and stored in the memory device for which the impedance ZiNQm is within the pre-determined threshold.

In some embodiments, any number, e.g., 10, 15, 20, 100, 200, 300, 1000, 10000, 100000, 1000000, etc., of load impedance fixtures, e.g., N, etc., are used to determine frequencies of the network analyzer 102 and variable capacitances of the impedance matching network 1 for which an impedance at the input 107 of the branch circuit of the impedance matching network 1 is within the pre-determined threshold of the pre-determined impedance. Each of the load impedance fixtures N mimics a different plasma condition of plasma within the plasma chamber.

It should be noted that in some embodiments, when the impedance matching network 1 is connected to a network analyzer, described herein, the impedance matching network 1 is not connected to a plasma chamber, which is further described below. Moreover, in various embodiments, when the impedance matching network 1 is connected to a network analyzer, described herein, there is no processing of a wafer in the plasma processing chamber. This saves on-tool time of using the plasma processing chamber.

Figure 2A:
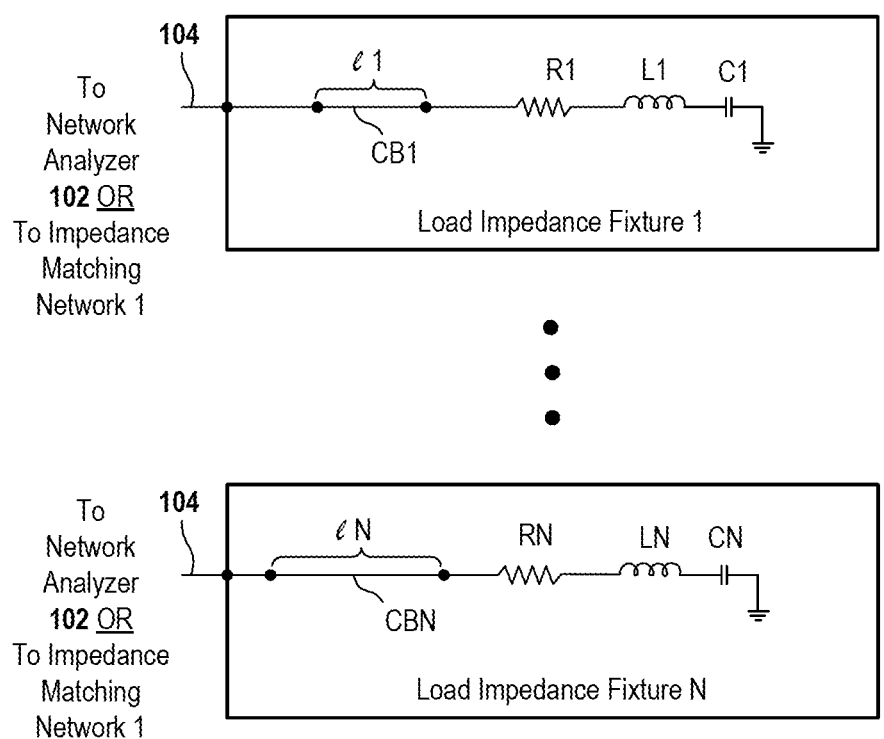
FIG. 2A is a diagram illustrating various embodiments of a load impedance fixture.

FIG. 2A is a diagram illustrating various embodiments of a load impedance fixture. The load impedance fixture 1 includes a cable CB1 of a length l1, a resistor R1, an inductor L1, and a capacitor C1. The resistor R1 has a resistance R1, the capacitor C1 has a capacitance C1, and the inductor L1 has an inductance L1. In some embodiments, the load impedance fixture 1 includes at least one of the cable CB1, the resistor R1, the inductor L1, and the capacitor C1. For example, the load impedance fixture 1 includes the cable CB1 and excludes the resistor R1, the inductor L1, the capacitor C1. As another example, the load impedance fixture 1 includes the inductor L1 and the capacitor C1, and excludes the cable CB1, and the resistor R1.

The load impedance fixture N includes a cable CBN of a length 1N, a resistor RN, an inductor LN, and a capacitor CN. The resistor RN has a resistance RN, the capacitor CN has a capacitance CN, and the inductor LN has an inductance LN. In some embodiments, the load impedance fixture N includes at least one of the cable CBN, the resistor RN, the inductor LN, and the capacitor CN. For example, the load impedance fixture N includes the cable CBN and excludes the resistor RN, the inductor LN, the capacitor CN. As another example, the load impedance fixture N includes the inductor LN and the capacitor CN, and excludes the cable CBN and the resistor RN. As yet another example, the load impedance fixture N includes the inductor LN, and excludes the capacitor CN, the cable CBN, and the resistor RN.

It should be noted that the load impedance fixture N has at least one of the cable length 1n, the resistance RN, the capacitance CN, and the inductance LN that is different from a corresponding one of the cable length 11, the resistance R1, the capacitance C1, and the inductance L1 of the load impedance fixture 1. For example, the resistance R1 is the same as that of the resistance RN, the capacitance C1 is the same as the capacitance CN, and the inductance L1 is the same as the inductance LN, and the cable length 11 is different from the cable length 1n. As another example, the resistance R1 is the same as that of the resistance RN, the capacitance C1 is the same as the capacitance CN, the cable length 11 is different from the cable length 1n, and the inductance L1 is different from the inductance LN. As yet another example, the load impedance fixture 1 excludes the resistor R1 and the load impedance fixture N includes the resistor RN. As yet another example, the load impedance fixture 1 excludes the cable CB1 and the load impedance fixture N includes the cable CBN. As another example, the resistance R1 is the same as that of the resistance RN, the capacitance C1 is different from the capacitance CN, the cable length 11 is the same as the cable length 1n, and the inductance L1 is different from the inductance LN.

In some embodiments, a plasma condition is represented using gamma or a power reflection ratio instead of impedance. Gamma is a voltage reflection coefficient, which is a ratio of reflected voltage to supplied voltage. The reflected voltage has an amplitude and phase relative to the supplied voltage so gamma is a complex number. The reflected voltage is voltage reflected towards an RF generator from the plasma chamber and the voltage supplied is voltage supplied from the RF generator to the impedance matching network 1 when the impedance matching network 1 is connected to the RF generator via an RF cable and is connected to the plasma chamber via an RF transmission line. The power reflection ratio is a square of gamma. It should be noted that for a 50 ohm RF cable connected to an input of the impedance matching network 1, there is a one-to-one relationship between the gamma at the input to the impedance matching network 1 and the impedance at the input of the impedance matching network 1, so whether to use the impedance or gamma is really a matter of convenience in a given situation.

In some embodiments, values of resistors used within the multiple load impedance fixtures 1 through N range between 0.4 ohms and 2 ohms. It should be noted that the range between 0.4 and 2 ohms is for a frequency of 60 MHz. When 2 MHz or 27 MHz frequency is used, the range changes. In various embodiments, a coaxial cable used within the load impedance fixture 1 or N is a 50 ohm cable.

Figure 2B:
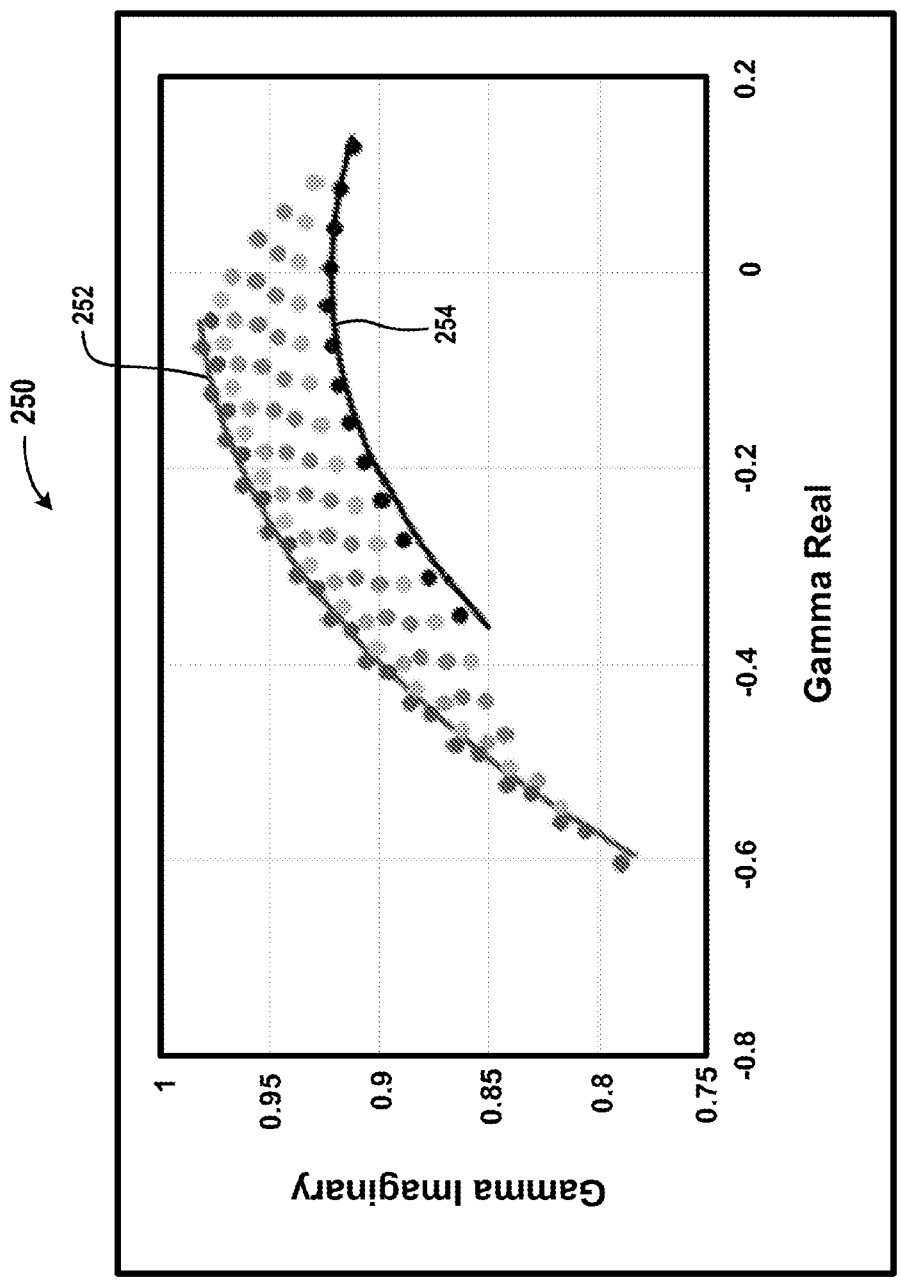
FIG. 2B is an embodiment of a graph to illustrate achievement of a variety of plasma conditions with use of the load impedance fixture 1 through load impedance fixture N.

FIG. 2B is an embodiment of a graph 250 to illustrate achievement of a variety of plasma conditions with use of the load impedance fixture 1 through load impedance fixture N. The graph 250 plots a real part of a reflection coefficient, which is represented by gamma, on an x-axis and an imaginary part of gamma on a y-axis. A top line 252 in the graph 250 is fitted to points that are measured by the network analyzer 102 for the variable capacitance C1 and different frequencies of the RF signal generated by the network analyzer 102 when coupled to the load impedance fixtures 1 through N having variable length coaxial cables and a resistor having a first value. Moreover, a bottom line 254 in the graph 250 is fitted to points that are measured by the network analyzer 102 for the variable capacitance CN and different frequencies of the RF signal generated by the network analyzer 102 when coupled to the load impedance fixtures 1 through N having variable length coaxial cables and a resistor having a second value. All points between the top line 252 and the bottom line 254 are measured by the network analyzer 102 for variable capacitances between the variable capacitance C1 and the variable capacitance CN and for different frequencies of the RF signal generated by the network analyzer 102 when coupled to the load impedance fixtures 1 through N.

Figure 3:
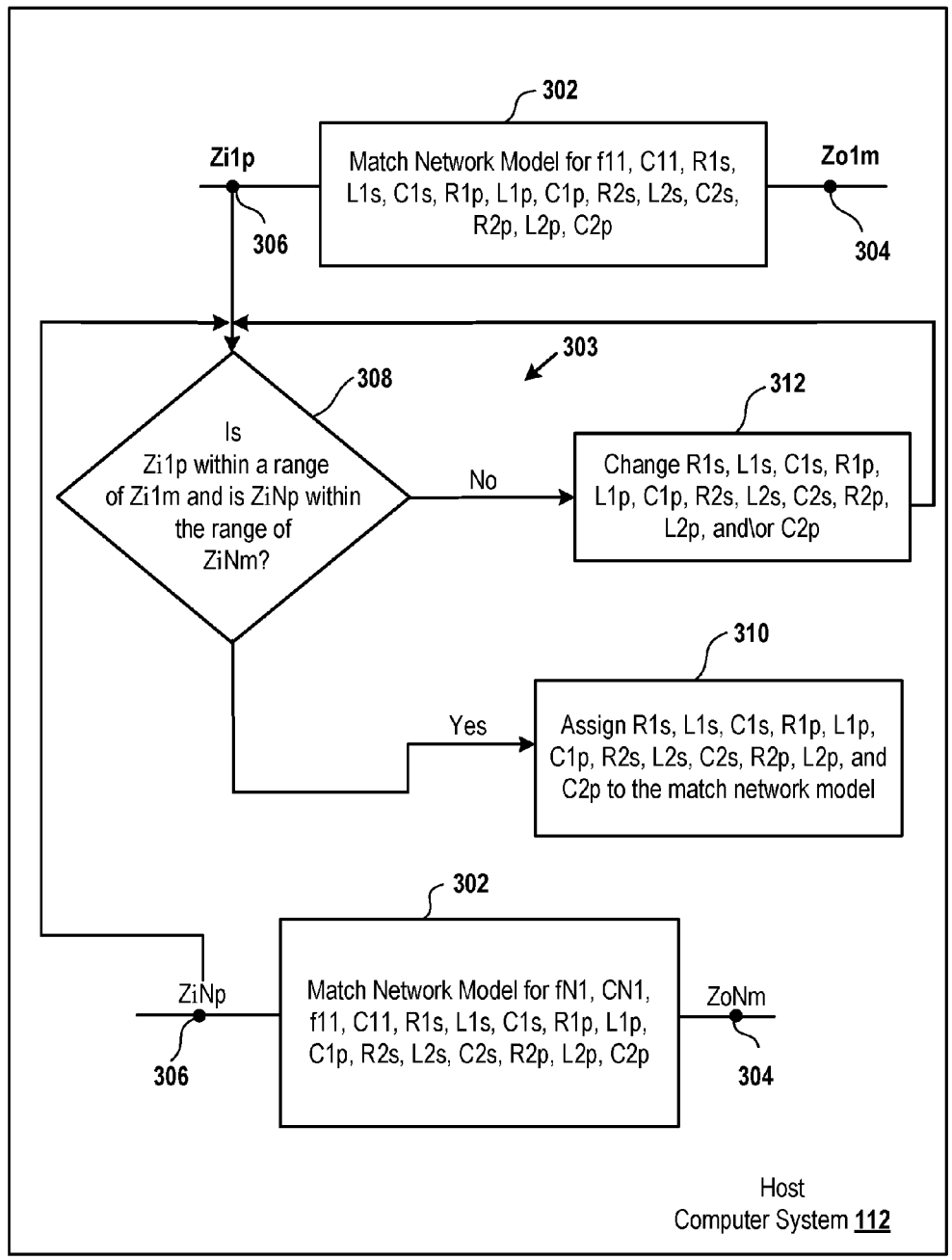
FIG. 3 is a diagram of an embodiment of a host computer system to illustrate determination of fixed parameters of the match network model.

FIG. 3 is a diagram of an embodiment of the host computer system 112 to illustrate determination of parameters of a match network model 302. An example of the match network model 302 is illustrated below with reference to FIG. 5. The match network model 302 includes a number of modules 1 through P, where P is an integer greater than zero. The module 1 includes a fixed series resistor R1$s$, fixed series inductor L1$s$, and a fixed series capacitor C1$s$. The module 1 further includes a fixed shunt resistor R1$p$, fixed shunt inductor L1$p$, and a fixed shunt capacitor C1$p$. Moreover, the module 2 includes a fixed series resistor R2$s$, fixed series inductor L2$s$, and a fixed series capacitor C2$s$. The module 2 further includes a fixed shunt resistor R2$p$, fixed shunt inductor L2$p$, and a fixed shunt capacitor C2$p$. Furthermore, the module 3 includes a fixed series resistor R3$s$, fixed series inductor L3$s$, and a fixed series capacitor C3$s$. The module 3 further includes a fixed shunt resistor R3$p$, fixed shunt inductor L3$p$, and a fixed shunt capacitor C3$p$. The match network model 302 is a computer-generated model of a portion of the impedance matching network 1. For example, the match network model 302 is a computer-generated model of the branch circuit of the impedance matching network 1 connected to the x MHz RF generator, or to the y MHz RF generator, or to the z MHz RF generator. The match network model 302 is generated by the processor of the host computer system 112.

The match network model 302 is derived from e.g., represents, etc., the branch circuit that is the portion of the impedance matching network 1. For example, when the x MHz RF generator is connected to the branch circuit that is a part of the impedance matching network 1, the match network model 302 represents, e.g., is a computer-generated model of, etc., the circuit of the impedance matching network 1. As another example, the match network model 302 does not have the same number of circuit components as that of the impedance matching network 1. The match network model 302 has a lower number of circuit elements than a number of circuit components of the branch circuit of the impedance matching network 1.

In some embodiments, the match network model 302 is a simplified form of the portion of the impedance matching network 1. For example, variable capacitances of multiple variable capacitors of the branch circuit of the impedance matching network 1 are combined into a combined variable capacitance represented by one or more variable capacitive elements of the impedance matching model, and/or fixed inductances of multiple fixed inductors of the branch circuit of the impedance matching network 1 are combined into a combined fixed inductance represented by one or more fixed inductive elements of the impedance matching model, and/or fixed resistances of multiple fixed resistors of the branch circuit of the impedance matching network 1 are combined into a combined fixed resistance represented by one or more of fixed resistive elements of the match network model 302. To illustrate, capacitances of capacitors that are in series are combined by inverting each of the capacitances to generate multiple inverted capacitances, summing the inverted capacitances to generate an inverted combined capacitance, and by inverting the inverted combined capacitance to generate a combined capacitance. As another illustration, multiple inductances of inductors that are connected in series are summed to generate a combined inductance and multiple resistances of resistors that are in series are combined to generate a combined resistance. All fixed capacitances of all fixed capacitors of the portion of the impedance matching network 1 are combined into a combined fixed capacitance of one or more fixed capacitive elements of the match network model 302. Other examples of the match network model 302 are provided in the patent application having application Ser. No. 14/716,797 and in the patent application having application Ser. No. 14/245,803. Also, a manner of generating a match network model from an impedance matching network is described in the patent application having application Ser. No. 14/245,803.

It should be noted that in some embodiments, a fixed parameter, e.g., resistance, capacitance, inductance, etc., is not variable. For example, the fixed parameter cannot be varied using the drive assembly while processing the wafer. Comparatively, a value of a variable parameter is modified during processing of the wafer.

In various embodiments, the match network model 302 has the same topology, e.g., connections between circuit elements, number of circuit elements, etc., as that of the portion of the impedance matching network 1. For example, if the branch circuit of the impedance matching network 1 includes a capacitor coupled in series with an inductor, the match network model 302 includes a capacitor coupled in series with an inductor. In this example, the inductors of the branch circuit of the impedance matching network 1 and of the match network model 302 have the same value and the capacitors of the branch circuit of the impedance matching network 1 and of the match network model 302 have the same value. As another example, if the portion of the impedance matching network 1 includes a capacitor coupled in parallel with an inductor, the match network model 302 includes a capacitor coupled in parallel with an inductor. In this example, the inductors of the branch circuit of the impedance matching network 1 and of the match network model 302 have the same value and the capacitors of the branch circuit of the impedance matching network 1 and of the match network model 302 have the same value. As another example, the match network model 302 has the same number and same types of circuit elements as that of circuit components of the impedance matching network 1 and has the same type of connections between the circuit elements as that between the circuit components. Examples of types of circuit elements include resistors, inductors, and capacitors, and examples of type of connections include serial, parallel, etc.

A method 303 is executed by the processor of the host computer system 112. The processor receives from the network analyzer 102 via a network cable the measured load impedance Zo1$m$ and the measured load impedance ZoN$m$. The processor initiates the match network model 302 to have the parameters including the frequency f11, the combined variable capacitance C11, the fixed inductances L1$s$, L1$p$, L2$s$, L2$p$, the fixed resistances R1$s$, R1$p$, R2$s$, R2$p$, and the fixed capacitances C1$s$, C1$p$, C2$s$, C2$p$. For the purpose of describing FIG. 3, the match network model 302 that has the modules 1 and 2 without having any of the remaining modules 3 through P is used. In some embodiments, instead of the combined variable capacitance C11, the match network model 302 is initialized to have the sum Sc1 and instead of the frequency f11, the match network model 302 is initialized to have the sum Sf1.

As an example, the parameters C11 and f11 applied to the match network model 302 mimic the impedance matching network 1 when the impedance matching network 1 is supplied the RF signal having the frequency f11 by the network analyzer 102 after being connected to the load impedance fixture 1, has one or more motor-driven capacitors having the combined variable capacitance of C11, has one or more fixed capacitors having a combined fixed capacitance of C1$s$, has one or more capacitors having a combined fixed capacitance of C2$s$, has one or more capacitors having a combined fixed capacitance of C1$p$, has one or more fixed capacitors having a combined fixed capacitance of C2$p$, has one or more fixed resistors having a combined fixed resistance of R1$s$, has one or more fixed resistors having a combined fixed resistance of R2$s$, has one or more fixed resistors having a combined fixed resistance of R1$p$, has one or more fixed resistors having a combined fixed resistance of R2$p$, has one or more fixed inductors having a combined fixed inductance of L1$s$, has one or more fixed inductors having a combined fixed inductance of L2$s$, has one or more fixed inductors having a combined fixed inductance of L1$p$, and has one or more fixed inductors having a combined fixed inductance of L2$p$.

In some embodiments, fixed parameter values of many elements of the match network model 302 are zero or the match network model 302 is not sensitive to fixed parameter values of the elements. For example, a large change in a value of a fixed element to which the match network model 302 is insensitive does not produce a large change in impedance of the match network model 302.

In some embodiments, a fixed element, e.g., an inductor, a resistor, a capacitor, etc., has a fixed parameter value that is not changed, e.g., using a motor, etc.

The processor calculates a predicted input impedance Zi1$p$, which is impedance at an input of the match network model 302 from the measured load impedance Zo1$m$ and the parameters f11, C11, L1$s$, L1$p$, L2$s$, L2$p$, R1$s$, R1$p$, R2$s$, R2$p$, C1$s$, C1$p$, C2$s$, and C2$p$, by back propagating the measured load impedance Zo1$m$ via the match network model 302. For example, the processor calculates an impedance ZC11 of the one or more capacitive elements having the variable capacitance C11 from the frequency f11 and from the capacitance C11, calculates an impedance ZL11$s$ of the inductor L1$s$ from the frequency f11 and from the inductance L1$s$, calculates an impedance ZL21$s$ of the inductor L2$s$ from the frequency f11 and from the inductance L2$s$, calculates an impedance ZL11$p$ of the inductor L1$p$ from the frequency f11 and from the inductance L1$p$, calculates an impedance ZL21$p$ of the inductor L2$p$ from the frequency f11 and from the inductance L2$p$, calculates an impedance ZC11$s$ of the capacitor C1$s$ from the frequency f11 and from the capacitance C1$s$, calculates an impedance ZC21$s$ of the capacitor C2$s$ from the frequency f11 and from the capacitance C2$s$, calculates an impedance ZC11$p$ of the capacitor C1$p$ from the frequency f11 and from the capacitance C1$p$, calculates an impedance ZC21$p$ of the capacitor C2$p$ from the frequency f11 and from the capacitance C2$p$, calculates an impedance ZR1$s$ as being the resistance R1$s$ of the resistor R1$s$, calculates an impedance ZR2$s$ as being the resistance R2$s$ of the resistor R2$s$, calculates an impedance ZR1$p$ as being the resistance R1$p$ of the resistor R1$p$, calculates an impedance ZR2$p$ as being the resistance R2$p$ of the resistor R2$p$. To illustrate, the processor calculates an impedance of a capacitor as being (1/j$\omega$C), and calculates an impedance of an inductor as being j$\omega$L, where $\omega$ is equal to 2$\pi$f11. The processor calculates the predicted input impedance Zi1$p$ by combining, e.g. summing, subtracting, generating a directional sum of, etc., the impedances ZC11, ZC11$s$, ZC21$s$, ZC11$p$, ZC21$p$, ZL11$s$, ZL21$s$ ZL11$p$, ZL21$p$, ZR1$s$, ZR2$s$, ZR1$p$, and ZR2$p$ with the measured load impedance Zo1$m$. For example, when the match network model 302 includes the module 1 without the modules 2 thru P, a directional sum of the impedances ZC11$p$, ZL11$p$, and ZR1$p$ is a sum of the impedances ZC11$p$, ZL11$p$, and ZR1$p$. In this example, the sum of the impedances is added to a sum of the impedances ZR1$s$, ZL11$s$, and ZC11$s$ to generate a directional sum of the impedances ZC11$p$, ZL11$p$, ZR1$p$, ZR1$s$, ZL11$s$, and ZC11$s$.

Similarly, the processor calculates a predicted input impedance ZiNp at the input 306 of the match network model 302 from the measured load impedance ZoNm applied at the output 304 and the parameters of the match network model 302 by back propagating the measured load impedance ZoNm via the match network model 302. For example, the processor changes the parameters of the match network model 302 from f11 to fN1, from C11 to CN1, but leaves the fixed parameters, e.g., L1$s$, L1$p$, L2$s$, L2$p$, R1$s$, R1$p$, R2$s$, R2$p$, C1$s$, C1$p$, C2$s$, and C2$p$, unchanged. In embodiments in which weighted capacitances and weighted frequencies are used, the processor changes the parameters of the match network model 302 from Sf1 to SfN and from Sc1 to ScN.

The parameters CN1 and fN1 applied to the match network model 302 mimic the impedance matching network 1 when the impedance matching network 1 is supplied the RF signal having the frequency fN1 by the network analyzer 102 after being connected to the load impedance fixture N, has one or more motor-driven capacitors having the combined variable capacitance of CN1, has one or more fixed capacitors having the combined fixed capacitance of C1$s$, has one or more fixed capacitors having the combined fixed capacitance of C2$s$, has one or more fixed capacitors having the combined fixed capacitance of C1$p$, has one or more fixed capacitors having the combined fixed capacitance of C2$p$, has one or more fixed resistors having the combined fixed resistance of R1$s$, has one or more fixed resistors having the combined fixed resistance of R2$s$, has one or more fixed resistors having the combined fixed resistance of R1$p$, has one or more fixed resistors having the combined fixed resistance of R2$p$, has one or more fixed inductors having the combined fixed inductance of L1$s$, has one or more fixed inductors having the combined fixed inductance of L2$s$, has one or more fixed inductors having the combined fixed inductance of L1$p$, and has one or more fixed inductors having the combined fixed inductance of L2$p$. The processor calculates an impedance ZCN1 of the one or more capacitive elements having the variable capacitance CN1 from the frequency fN1 and from the capacitance CN1, calculates an impedance ZL1Ns of the inductor L1$s$ from the frequency fN1 and from the inductance L1$s$, calculates an impedance ZL2Ns of the inductor L2$s$ from the frequency fN1 and from the inductance L2$s$, calculates an impedance ZL1Np of the inductor L1$p$ from the frequency fN1 and from the inductance L1$p$, calculates an impedance ZL2Np of the inductor L2$p$ from the frequency fN1 and from the inductance L2$p$, calculates an impedance ZC1Ns of the capacitor C1$s$ from the frequency fN1 and from the capacitance C1$s$, calculates an impedance ZC2Ns of the capacitor C2$s$ from the frequency fN1 and from the capacitance C2$s$, calculates an impedance ZC1Np of the capacitor C1$p$ from the frequency fN1 and from the capacitance C1$p$, calculates an impedance ZC2Np of the capacitor C2$p$ from the frequency fN1 and from the capacitance C2$p$, and calculates the impedances ZR1$s$, ZR2$s$, ZR1$p$, and the impedance ZR2$p$. To illustrate, the processor calculates an impedance of a capacitor as being (1/j$\omega$C), and calculates an impedance of an inductor as being j$\omega$L, where $\omega$ is equal to 2$\pi$fN1. The processor calculates the predicted input impedance ZiNp by combining, e g summing, subtracting, etc., the impedances ZCN1, ZC1Ns, ZC2Ns, ZC1Np, ZC2Np, ZL1Ns, ZL2Ns ZL1Np, ZL2Np, ZR1$s$, ZR2$s$, ZR1$p$, and ZR2$p$ from the output measured load ZoNm to determine the predicted input impedance ZiNp in a manner similar to that described above for calculating the predicted input impedance Zi1$p$ by combining the impedances ZC11, ZC11$s$, ZC21$s$, ZC11$p$, ZC21$p$, ZL11$s$, ZL21$s$ ZL11$p$, ZL21$p$, ZR1$s$, ZR2$s$, ZR1$p$, and ZR2$p$ with the output measured load Zo1$m$.

In an operation 308 of the method 303, the processor of the host computer system 112 determines whether the predicted input impedance Zi1$p$ is within a pre-determined range from the measured input impedance Zi1$m$ and whether the predicted input impedance ZiNp is within the pre-determined range from the measured input impedance ZiNm. For example, the determinations of whether the predicted input impedance Zi1$p$ is within the pre-determined range from the measured input impedance Zi1$m$ and whether the predicted input impedance ZiNp is within the pre-determined range from the measured input impedance ZiNm are executed simultaneously, e.g., at the same time, during the same clock cycle, etc., by the processor. It should be noted that the operation 308 is performed for all the load impedance fixtures. For example, if three load impedance fixtures 1, 2, and 3 are used in a manner described above in which the load impedance fixtures 1 and 2 are used, the processor determines whether the predicted input impedance Zi1$p$ is within the pre-determined range from the measured input impedance Zi1$m$, whether a predicted input impedance Zi2$p$ is within the pre-determined range from a measured input impedance Zi2$m$, and whether the predicted input impedance ZiNp is within the pre-determined range from the measured input impedance ZiNm. The measured input impedance Zi2$m$ is measured by the network analyzer 102 when a load impedance fixture 2 is connected to the impedance matching network 1 via the RF cable 108 (FIG. 1B) and the impedance matching network 1 is further connected to the network analyzer 102 via the RF cable 106 (FIG. 1B). Moreover, the predicted input impedance Zi2$p$ is calculated by the processor in a similar manner in which the predicted input impedances Zi1$p$ and ZiNp are calculated by the processor.

Upon determining that the predicted input impedance Zi1$p$ is within the pre-determined range from the measured input impedance Zi1m and that the predicted input impedance ZiNp is within the pre-determined range from the measured input impedance ZiNm, in an operation 310 of the method 300, the processor assigns the fixed parameters L1s, L1p, L2s, L2p, R1s, R1p, R2s, R2p, C1s, C1p, C2s, and C2p to the match network model 302 for use with the impedance matching network 1. For example, the processor maps the fixed parameters L1s, L1p, L2s, L2p, R1s, R1p, R2s, R2p, C1s, C1p, C2s, and C2p to an identification number, e.g., ID1, etc., of the impedance matching network 1, and stores the mapping, the parameters, and the identification number in the memory device of the host computer system 112. On the other hand, upon determining that the predicted input impedance Zi1p is not within the pre-determined range from the measured input impedance Zi1m or that the predicted input impedance ZiNp is not within the pre-determined range from the measured input impedance ZiNm, the processor, in an operation 312 of the method 303, changes one or more of the fixed parameters L1s, L1p, L2s, L2p, R1s, R1p, R2s, R2p, C1s, C1p, C2s, and C2p to generate one or more changed parameters.

In various embodiments, the processor is provided a pre-determined range of values of one or more of the parameters L1s, L1p, L2s, L2p, R1s, R1p, R2s, R2p, C1s, C1p, C2s, and C2p by the user via the input device that is connected to the processor and the one or more of the parameters are changed to be within the pre-determined range. For example, the user indicates to the processor that the parameter L1s is to be changed by 5% from a value, which is also provided to the processor by the user via the input device. During the operation 312, the processor changes the value of the parameter L1s by 5%. As another example, the user indicates to the processor that the parameter C1s is to be changed by 2% from a value, which is also provided to the processor by the user via the input device. During the operation 312, the processor changes the value of the parameter C1s by 2%. As another example, the user indicates to the processor that the parameter C1s is to be changed by 0% from a value, which is also provided to the processor by the user via the input device. During the operation 312, the processor changes the value of the parameter C1s by 0%.

In some embodiments, instead of or in addition to changing one or more of the fixed parameters, L1s, L1p, L2s, L2p, R1s, R1p, R2s, R2p, C1s, C1p, C2s, and C2p, the processor, in the operation 312, changes the capacitance C11. For example, the capacitance C11 is a variable capacitance of one of the modules of the match network model 302 and the variable capacitance represents a motor-driven capacitor of the impedance matching network 1. In this example, the capacitance C11 is represented by an equation that is a sum of a constant term, a linear term, and a quadratic term. The linear term is a product of a first coefficient and a variable, e.g., a position in motor shaft revolution, etc. The quadratic term is a product of a second coefficient and a square of the variable. The processor, in the operation 312, changes a value of the constant, and/or the first coefficient, and/or the second coefficient to change the variable capacitance C11.

The processor repeats the operation 308 using the one or more changed parameters to determine whether the predicted input impedance Zi1p for the changed parameters is within the pre-determined range from the measured input impedance Zi1m and whether the predicted input impedance ZiNp for the changed parameters is within the pre-determined range from the measured input impedance ZiNm. In this manner, the processor repeats the operation 308 until the predicted input impedance Zi1p is within the pre-determined range from the measured input impedance Zi1m and the predicted input impedance ZiNp is within the pre-determined range from the measured input impedance ZiNm to find one or more values of the one or more corresponding changed parameters for the match network model 302. The one or more values of the one or more corresponding changed parameters are then assigned to the match network model 302. For example, the processor maps the changed parameters to the identification number of the impedance matching network 1, and stores the mapping, the changed parameters, and the identification number in the memory device of the host computer system 112.

It should be noted that in some embodiments, a value of a parameter is the same as the parameter. For example, each of the parameters L1s, L1p, L2s, L2p, R1s, R1p, R2s, R2p, C1s, C1p, C2s, and C2p is a value. Hence, when the value changes, the parameter changes.

In the embodiments in which the measured input impedance Zi1m is not within the pre-determined threshold of the pre-determined impedance as determined by the operation 132 of FIG. 1A and the measured input impedance ZiNm is not within the pre-determined threshold of the pre-determined impedance as determined by the operation 152 of FIG. 1B, the operation 308 is performed for the measured input impedances Zi1Qm and ZiNQm (see FIGS. 1A and 1B). For example, it is determined in the operation 308 whether the predicted input impedance Zi1p obtained for the measured input impedance Zi1Qm is within the pre-determined range of the measured input impedance Zi1Qm and whether the predicted input impedance ZiNp obtained for the measured input impedance ZiNQm is within the pre-determined range of the measured input impedance ZiNQm. Upon determining that the predicted input impedance Zi1p is within the pre-determined range of the measured input impedance Zi1Qm and that the predicted input impedance ZiNp is within the pre-determined range of the measured input impedance ZiNQm, the operation 310 is performed. On the other hand, upon determining that the predicted input impedance Zi1p is not within the pre-determined range of the measured input impedance Zi1Qm and that the predicted input impedance ZiNp is not within the pre-determined range of the measured input impedance ZiNQm, the operation 312 is performed.

Figure 4:
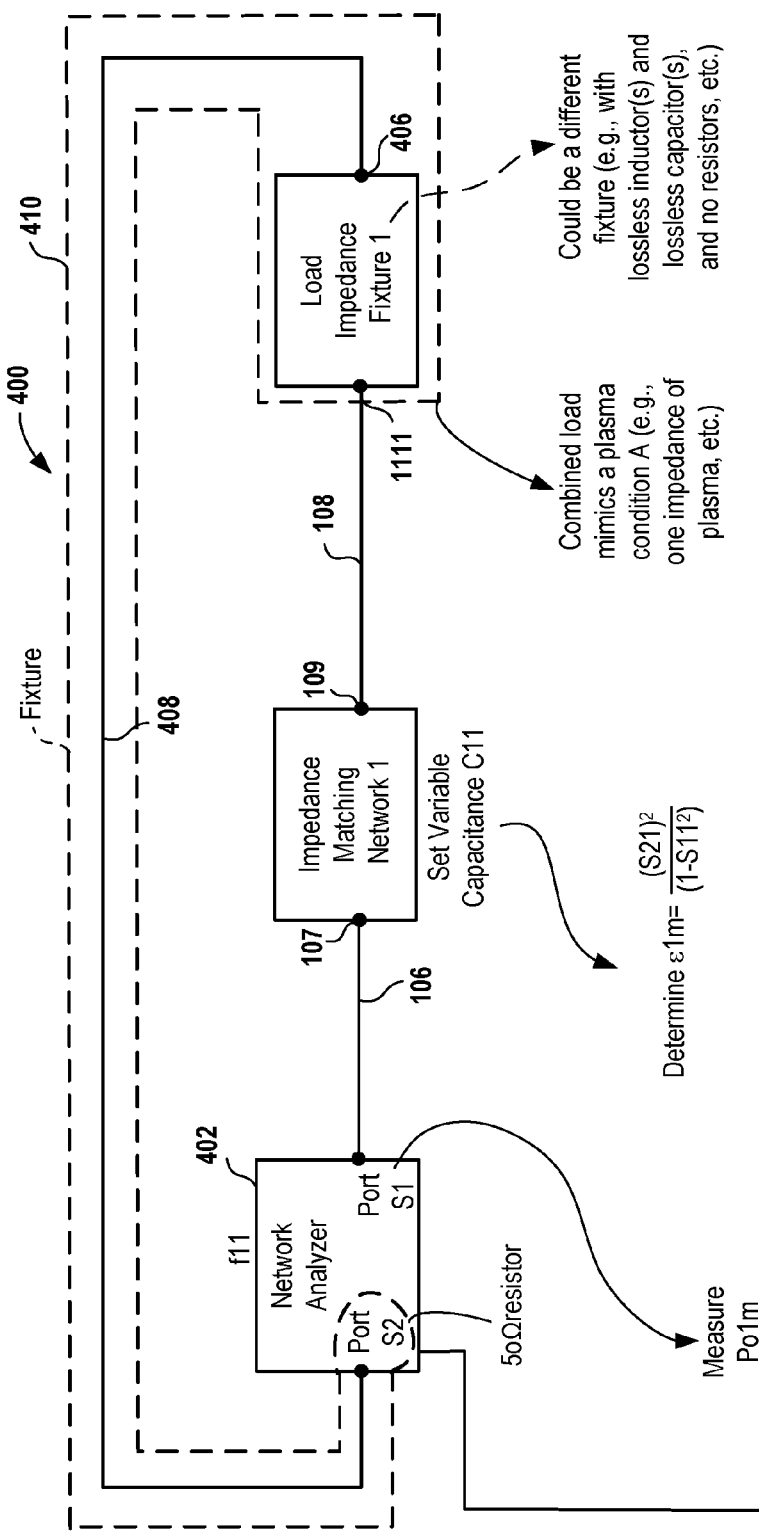
FIG. 4 is a diagram of an embodiment of a system to illustrate determination of a measured efficiency of the impedance matching network.

FIG. 4 is a diagram of an embodiment of a system 400 to illustrate determination of an efficiency of the impedance matching network 1. The system 400 includes a network analyzer 402, the impedance matching network 1, the load impedance fixture 1, and the host computer system 112. The host computer system 112 is connected to the network analyzer 402 via a network cable 404.

The network analyzer 402 has a port S1 and another port S2. In some embodiments, the port S2 is an input port and the port S1 is an output port. The port S1 is connected to the input 107 of the impedance matching network 1 via the RF cable 106 and the port S2 is connected to an output 406 of the load impedance fixture 1 via an RF cable 408. It should be noted that the output 109 of the impedance matching network 1 is connected to a combined load fixture 410 that includes inductances and/or capacitances of the load impedance fixture 1 and a resistance, e.g. 50 ohms, between 49 and 51 ohms, etc., of the port S2. In some embodiments, an impedance of the combined load fixture 410 mimics a plasma condition A, e.g., one impedance of plasma, a pre-determined range of impedances of plasma, etc.

When a combined variable capacitance of the one or more variable capacitors of the impedance matching network 1 is set to the value C11, the network analyzer 402 operates at the frequency f11. For example, the network analyzer 402 generates an RF signal having the frequency f11 and sends the RF signal from the port S1 via the RF cable 106 to the input 107 of the impedance matching network 1. In some embodiments the combined variable capacitance of the one or more variable capacitors of the impedance matching network 1 is set to a value different from the value C11, and the network analyzer 402 is operated at a frequency different from the frequency f11. The impedance matching network 1 receives the RF signal and matches an impedance of a load, e.g., the RF cable 108, and the combined load fixture 410, etc., with that of a source, e.g., the RF cable 106 and the port S1, etc., to generate a modified RF signal. The modified RF signal is provided to the combined load fixture 410. For example, the modified RF signal passes via the load impedance fixture 1 to the port S2 of the network analyzer 402.

When the modified RF signal is provided to the combined load fixture 410, the network analyzer 402 measures an S21 parameter, an S11 parameter, and an amount of power Po1m output by the RF signal at the S1 port. For example, the network analyzer 402 measures, at the port S1, the power Po1m supplied by the RF signal sent via the RF cable 106 to the impedance matching network 1. The parameters S11 and S12 are scattering parameters. The scattering parameters S11 and S21 are voltage parameters and associated powers are square of the scattering parameters. For example, a ratio of the power input to the port S1 to the power out from the port S1 is S11² and a ratio of the power input to the port S2 to the power out from the port S1 is S21². The network analyzer 402 sends the amount of power Po1m, the S11 parameter, and the S21 parameter to the processor of the host computer system 112 via the network cable 404. When a combined variable capacitance of the one or more variable capacitors of the impedance matching network 1 is set to the value C11 and the network analyzer 402 operates at the frequency f11, the processor calculates an efficiency ∈1m of the impedance matching network 1 as a ratio of a square of the S21 parameter and a difference between one and a square of the S11 parameter. The ratio is represented as $$\varepsilon 1m = \frac{S21^2}{1 - S11^2} \quad \text{equation (1)}$$

It should be noted that in some embodiments, a measured efficiency of the impedance matching network 1 is not a single number but instead depends on an impedance of a load connected to the impedance matching network 1.

In some embodiments, the efficiency is ∈1m is measured using the equation (1) when the load impedance fixture 1 is designed to be lossless or have minimal loss of power, e.g., power lost in the load impedance fixture 1 is substantially less than power lost in the impedance matching network 1, etc. The efficiency ∈1m is that of the combined load fixture 410. In some embodiments, the ratio is modified in case the load impedance fixture 1 has a small amount of power loss. While in some embodiments, the efficiency ∈1m is determined at any value of the combined variable capacitance of the impedance matching network 1 and RF frequency of the network analyzer 402, the efficiency ∈1m is accurate for small values of S11² and becomes inaccurate as S11² becomes larger. In various embodiments, the efficiency ∈1m is determined when the impedance matching network 1 is tuned or almost tuned, e.g., when the combined variable capacitance of the impedance matching network 1 and RF frequency of the network analyzer 402 are such that S11² is close to 0. The efficiency ∈1m is sometimes referred to herein as a measured efficiency.

In some embodiments, instead of the load impedance fixture 1, another load impedance fixture A is connected to the impedance matching network 1 and to the port S2 of the network analyzer 402. The load impedance fixture A has the same structure as that of the load impedance fixture 1 except that the load impedance fixture A includes one or more lossless capacitors, and/or one or more lossless inductors, and does not include any resistors. For example the load impedance fixture A includes one or more lossless capacitors coupled in series with one or more lossless inductors. The one or more lossless capacitors are connected to the input 1111 and the one or more lossless inductors are coupled to the output 406. As another example, the load impedance fixture A includes one or more lossless capacitors coupled in series with one or more lossless inductors. The one or more lossless inductors are connected to the input 1111 and the one or more lossless capacitors are coupled to the output 406.

In some embodiments, a lossless circuit component, e.g., inductor, capacitor, resistor etc., is one in which there is none or less than a pre-determined amount of loss of power when a current passes through the circuit component.

Figure 5:
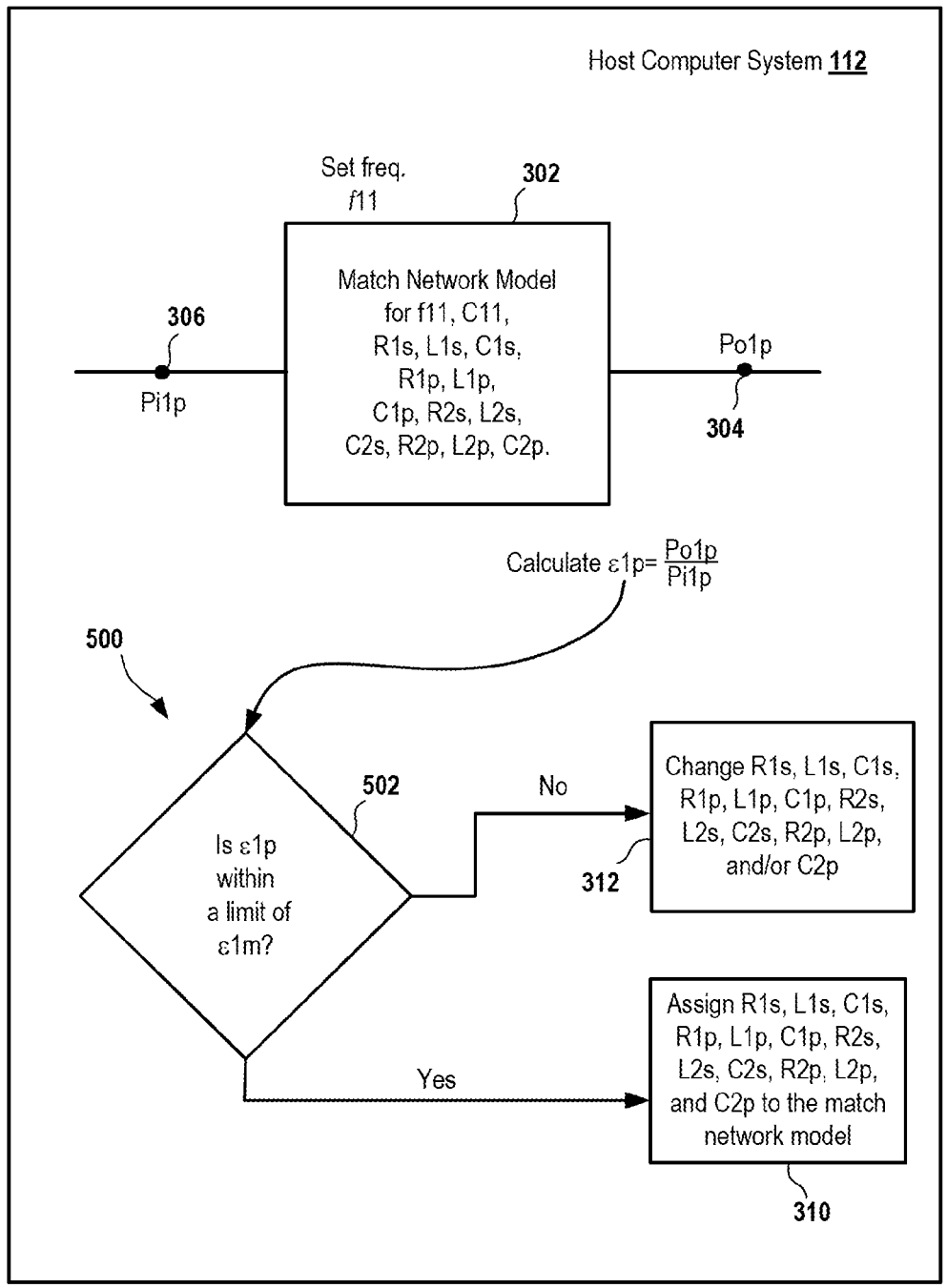
FIG. 5 is a diagram of an embodiment of the host computer system to illustrate determination of values of the fixed parameters based on the measured efficiency when the impedance matching network is connected to the load impedance fixture 1 and a predicted efficiency.

FIG. 5 is a diagram of an embodiment of the host computer system 112 to illustrate determination of values of the fixed parameters L1s, L1p, L2s, L2p, R1s, R1p, R2s, R2p, C1s, C1p, C2s, and C2p. The match network model 302 is initialized to have the radio frequency f11, the capacitance C11, and the fixed parameters L1s, L1p, L2s, L2p, R1s, R1p, R2s, R2p, C1s, C1p, C2s, and C2p. For example, the user via the input device provides the fixed values f11, C11, L1s, L1p, L2s, L2p, R1s, R1p, R2s, R2p, C1s, C1p, C2s, and C2p to the processor of the host computer system 112 for initializing the match network model 302. In some embodiments, instead of the combined variable capacitance C11, the match network model 302 is initialized to have the sum Sc1 and instead of the frequency f11, the match network model 302 is initialized to have the sum Sf1.

The processor receives the measured output power Po1m via the network cable 404 from the network analyzer 402. During a time the match network model 302 is initialized to have the radio frequency f11, the capacitance C11, and the parameters L1s, L1p, L2s, L2p, R1s, R1p, R2s, R2p, C1s, C1p, C2s, and C2p, the processor applies an input power Pi1p at the input 306 of the match network model 302 and forward propagates the input power Pi1p via the circuit elements of the match network model 302 to calculate a predicted output power Po1p at the output 304 of the match network model 302. For example, when the match network model 302 includes a series combination of the circuit elements R1s, C1s, L1s, and C11 an amount of current is propagated via the series combination to determine a power PRs consumed by the resistor R1s, a power PCs consumed by the capacitor C1s, a power PLs consumed by the inductor Ls, and a power PC1s consumed by the capacitor C11. The processor calculates a directional sum of the input power Pi1p, the power PRs, the power PCs, the power PLs, and the power PC1s to compute the predicted output power Po1p.

In some embodiments, the input power Pi1p is the same as the power Po1m. In various embodiments, the input power Pi1p is a randomly selected by the processor of the host computer system 112. In various embodiments, the input power Pi1p is received from the user via the input device connected to the processor.

The processor calculates a predicted efficiency $\in 1p$ of the match network model 302 as a ratio of the predicted output power Po1p and the input power Pi1p. The processor applies a method 500 for determining whether to change one or more fixed values of the one or more of the corresponding fixed parameters L1s, L1p, L2s, L2p, R1s, R1p, R2s, R2p, C1s, C1p, C2s, and C2p of the match network model 302. For example, in an operation 502, the processor determines whether the predicted efficiency $\in 1p$ is within a pre-determined limit of the measured efficiency $\in 1m$. The pre-determined limit is provided as input via the input device to the processor. For example, the pre-determined limit is provided to the processor before the operation 502 or before the method 500 is performed. Upon determining that the predicted efficiency $\in 1p$ is within the pre-determined limit of the measured efficiency $\in 1m$, the processor assigns, in the operation 310, the fixed values of the parameters L1s, L1p, L2s, L2p, R1s, R1p, R2s, R2p, C1s, C1p, C2s, and C2p to the match network model 302 for use with the impedance matching network 1. On the other hand, upon determining that the predicted efficiency $\in 1p$ is not within the pre-determined limit of the measured efficiency $\in 1m$, the processor changes, in the operation 312, one or more values of one or more of the parameters L1s, L1p, L2s, L2p, R1s, R1p, R2s, R2p, C1s, C1p, C2s, and C2p to generate the one or more changed parameters. To illustrate, the processor changes a value of the inductor L1s from V1 to V2 to generate the one or more changed parameters. As another illustration, the processor changes a value of the inductor L1s from V1 to V2 and a value of the capacitor C1s from W1 to W2 to generate the one or more changed parameters.

The processor repeats the operation 502 using the one or more changed parameters to determine whether the predicted efficiency $\in 1p$ for the changed parameters is within the pre-determined limit from the measured efficiency $\in 1m$. In this manner, the processor repeats the operation 502 until the predicted efficiency $\in 1p$ is within the pre-determined limit from the measured efficiency $\in 1m$ to find one or more values of the one or more corresponding changed parameters for the match network model 302. The one or more values of the one or more corresponding changed parameters are then assigned to the match network model 302. For example, the processor maps the one or more changed parameters to the identification number of the impedance matching network 1, and stores the mapping, the one or more changed parameters, and the identification number of the match network model 302 into the memory device of the host computer system 112.

In some embodiments, instead of or in addition to changing one or more of the fixed parameters, L1s, L1p, L2s, L2p, R1s, R1p, R2s, R2p, C1s, C1p, C2s, and C2p, the processor, in the operation 312 of the method 500, changes the variable capacitance C11 in the same manner as that described above.

Figure 6:
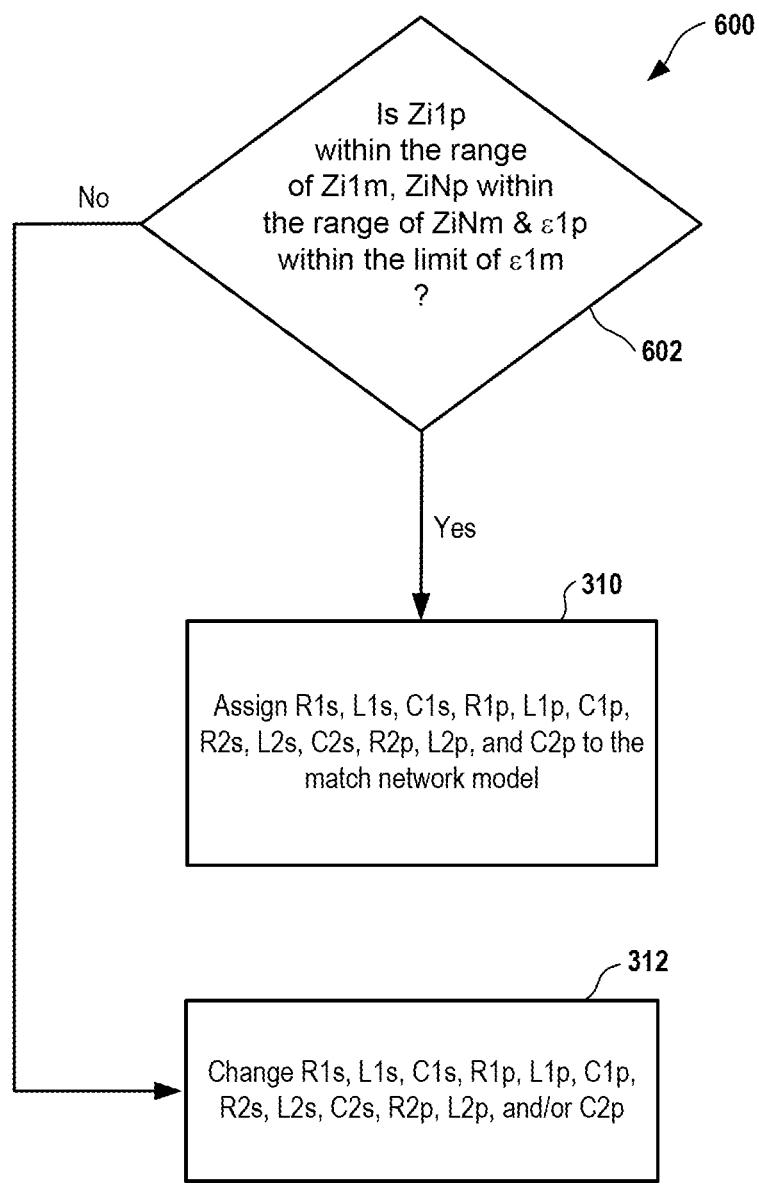
FIG. 6 is a flowchart of an embodiment of a method to determine the fixed parameters by using impedances and efficiencies.

FIG. 6 is a flowchart of an embodiment of a method 600 to determine the fixed parameters, L1s, L1p, L2s, L2p, R1s, R1p, R2s, R2p, C1s, C1p, C2s, and C2p using the impedances Zi1p, Zi1m, ZiNp, ZiNm, and the efficiencies $\in 1m$ and $\in 1p$. The method 600 is executed by the processor of the host computer system 112. In an operation 602 of the method 600, it is determined by the processor whether the predicted input impedance Zi1p is within the pre-determined range of the input impedance Zi1m, whether the predicted input impedance ZiNp is within the pre-determined range of the input impedance ZiNm, and whether the predicted efficiency $\in 1p$ is within the pre-determined limit from the measured efficiency £1m.

Upon determining that the predicted input impedance Zi1p is within the pre-determined range of the input impedance Zi1m, the predicted input impedance ZiNp is within the pre-determined range of the input impedance ZiNm, and the predicted efficiency $\in 1p$ is within the pre-determined limit from the measured efficiency $\in 1m$, the operation 310 is performed by the processor. On the other hand, upon determining that the predicted input impedance Zi1p is not within the pre-determined range of the input impedance Zi1m, or the predicted input impedance ZiNp is not within the pre-determined range of the input impedance ZiNm, or the predicted efficiency $\in 1p$ is not within the pre-determined limit from the measured efficiency $\in 1m$, the processor performs the operation 312.

In some embodiments, the processor performs the operation 312 upon determining that the predicted input impedance Zi1p is not within the pre-determined range of the input impedance Zi1m, or the predicted input impedance ZiNp is not within the pre-determined range of the input impedance ZiNm, or the predicted efficiency $\in 1p$ is not within the pre-determined limit from the measured efficiency $\in 1m$, or a combination of two or more thereof. For example, the processor performs the operation 312 upon determining that the predicted input impedance Zi1p is not within the pre-determined range of the input impedance Zi1m and the predicted input impedance ZiNp is not within the pre-determined range of the input impedance ZiNm, and the predicted efficiency $\in 1p$ is not within the pre-determined limit from the measured efficiency $\in 1m$.

The processor repeats the operation 602 using the one or more changed parameters to determine whether the predicted input impedance Zi1p is within the pre-determined range of the input impedance Zi1m, whether the predicted input impedance ZiNp is within the pre-determined range of the input impedance ZiNm, and whether the predicted efficiency $\in 1p$ is within the pre-determined limit from the measured efficiency $\in 1m$. In this manner, the processor repeats the operation 602 until the predicted input impedance Zi1p is within the pre-determined range of the input impedance Zi1m, the predicted input impedance ZiNp is within the pre-determined range of the input impedance ZiNm, and the predicted efficiency $\in 1p$ is within the pre-determined limit from the measured efficiency $\in 1m$ to find one or more values of the one or more corresponding changed parameters for the match network model 302. The one or more values of the one or more corresponding changed parameters are then assigned to the match network model 302. For example, the processor maps the changed parameters to the identification number of the impedance matching network 1, and stores the mapping, the identification number, and the one or more changed parameters in the memory device of the host computer system 112.

In some embodiments, instead of or in addition to changing one or more of the fixed parameters, L1s, L1p, L2s, L2p, R1s, R1p, R2s, R2p, C1s, C1p, C2s, and C2p, the processor, in the operation 312 of the method 600, changes the variable capacitance C11 in the same manner as that described above.

Figure 7:
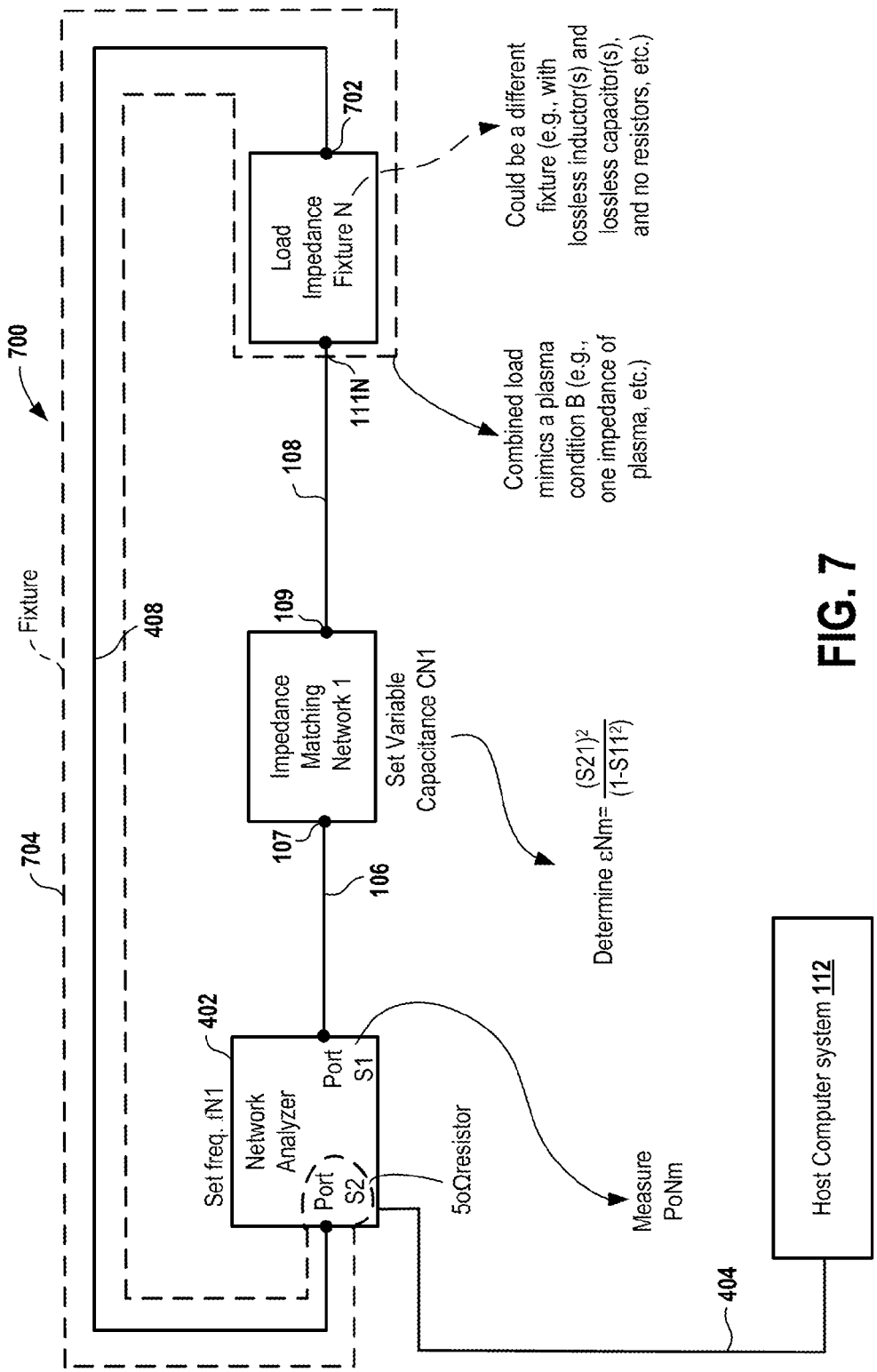
FIG. 7 is a diagram of an embodiment of a system to illustrate determination of a measured efficiency of the impedance matching network when the impedance matching network is connected to the load impedance fixture N.

FIG. 7 is a diagram of an embodiment of a system 700 to illustrate determination of an efficiency of the impedance matching network 1 when the impedance matching network 1 is connected to the load impedance fixture N. The system 700 includes the network analyzer 402, the impedance matching network 1, the load impedance fixture N, and the host computer system 112.

The port S2 is connected to an output 702 of the load impedance fixture N via the RF cable 408. It should be noted that the output 109 of the impedance matching network 1 is connected via the RF cable 108 to a combined load fixture 704 that includes inductances and/or capacitances of the load impedance fixture N and the resistance of the port S2. In some embodiments, an impedance of the combined load fixture 704 mimics a plasma condition B, e.g., one impedance of plasma, a pre-determined range of impedances of plasma, etc., and the plasma condition B is different from the plasma condition A. For example, an impedance exhibited by the combined load fixture 704 is different from an impedance exhibited by the combined load fixture 410 (FIG. 4). As another example, the pre-determined range of impedances exhibited by the combined load fixture 704 is exclusive of the pre-determined range of impedances exhibited by the combined load fixture 410.

When a combined variable capacitance of the one or more variable capacitors of the impedance matching network 1 is set to the value CN1, the network analyzer 402 operates at the frequency fN1. For example, the network analyzer 402 generates an RF signal having the frequency fN1 and sends the RF signal from the port S1 via the RF cable 106 to the input 107 of the impedance matching network 1. In some embodiments, the combined variable capacitance of the one or more variable capacitors of the impedance matching network 1 is set to a value different from the value CN1, and the network analyzer 402 is operated at a frequency different from the frequency fN1. The impedance matching network 1 receives the RF signal and matches an impedance of a load, e.g., the RF cable 108, the load impedance fixture N, and the port S2, etc., connected to the output 109 of the impedance matching network 1 with that of a source, e.g., the RF cable 106 and the port S1, etc., connected to the input 107 of the impedance matching network 1 to generate a modified RF signal. The modified RF signal is provided to the combined load fixture 704. For example, the modified RF signal passes via the load impedance fixture N to the port S2 of the network analyzer 402.

When the modified RF signal is provided to the combined load fixture 704, the network analyzer 402 measures an S21 parameter, an S11 parameter, and an amount of power PoNm of the RF signal output at the S1 port. For example, the network analyzer 402 measures, at the port S1, the power PoNm supplied by the RF signal sent via the RF cable 106 to the impedance matching network 1. The network analyzer 402 sends the S11 parameter, the S21 parameter, and the power PoNm to the processor of the host computer system 112 via the network cable 404. The processor calculates an efficiency ∈Nm of the impedance matching network 1 as a ratio of a square of the S21 parameter and a difference between one and a square of the S11 parameter.

The ratio is represented as $$\varepsilon Nm = \frac{S21^2}{1 - S11^2} \qquad \text{equation (2)}$$

The efficiency ∈Nm is that of the combined load fixture 704. In some embodiments, the efficiency is ∈Nm is measured using the equation (2) when the load impedance fixture N is designed to is lossless or to have minimal loss of power, e.g., power lost in the load impedance fixture N is substantially less than power lost in the impedance matching network 1, etc. In some embodiments, the ratio is modified in case the load impedance fixture N has a small amount of power loss. While in some embodiments, the efficiency ∈Nm is determined at any value of the combined variable capacitance of the impedance matching network 1 and RF frequency of the network analyzer 402, the efficiency ∈Nm is accurate for small values of $S11^2$ and becomes inaccurate as $S11^2$ becomes larger. In various embodiments, the efficiency ∈Nm is determined when the impedance matching network 1 is tuned or almost tuned, e.g., when the combined variable capacitance of the impedance matching network 1 and RF frequency of the network analyzer 402 are such that $S11^2$ is close to 0.

In some embodiments, instead of the load impedance fixture N, another load impedance fixture B is connected to the impedance matching network 1 and to the port S2 of the network analyzer 402. The load impedance fixture B has the same structure as that of the load impedance fixture N except that the load impedance fixture B includes one or more lossless capacitors, and/or one or more lossless inductors, and does not include any resistors. For example the load impedance fixture B includes one or more lossless capacitors coupled in series with one or more lossless inductors. The one or more lossless capacitors are connected to the input 111N and the one or more lossless inductors are coupled to the output 702. As another example, the load impedance fixture B includes one or more lossless capacitors coupled in series with one or more lossless inductors. The one or more lossless inductors are connected to the input 111N and the one or more lossless capacitors are coupled to the output 702.

Figure 8:
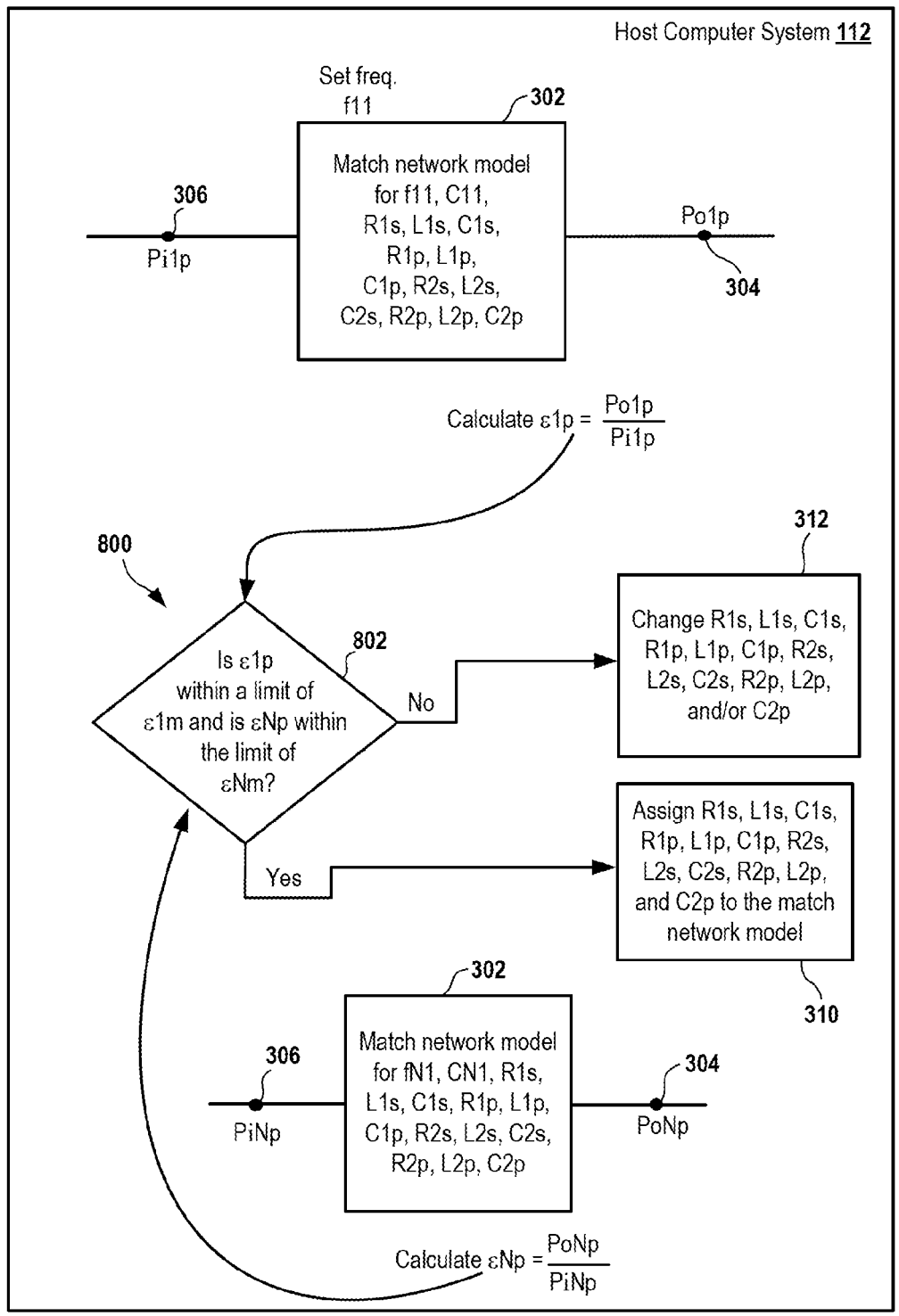
FIG. 8 is a diagram to illustrate a method executed by the host computer system to determine values of the fixed parameters based on the measured efficiency when the impedance matching network is connected to the load impedance fixture N and a predicted efficiency.

FIG. 8 is a diagram to illustrate a method 800 executed by the host computer system 112 to determine values of the fixed parameters L1s, L1p, L2s, L2p, R1s, R1p, R2s, R2p, C1s, C1p, C2s, and C2p. The predicted efficiency ∈1p is determined using the match network model 302 as described above with reference to FIG. 5. Moreover, the match network model 302 is initialized to have the radio frequency fN1, the capacitance CN1, and the fixed parameters L1s, L1p, L2s, L2p, R1s, R1p, R2s, R2p, C1s, C1p, C2s, and C2p. For example, the user via the input device provides the values fN1, CN1, L1s, L1p, L2s, L2p, R1s, R1p, R2s, R2p, C1s, C1p, C2s, and C2p to the processor of the host computer system 112 for initializing the match network model 302. In embodiments in which weighted capacitances and weighted frequencies are used, the processor changes the parameters of the match network model 302 from Sf1 to SfN and from Sc1 to ScN. For example, instead of the capacitance CN1, the value ScN is used and instead of the value fN1, the value SfN is used.

The processor receives the measured output power PoNm from the network analyzer 402 via the network cable 404. During a time the match network model 302 is initialized to have the radio frequency fN1, the capacitance CN1, and the fixed parameters L1s, L1p, L2s, L2p, R1s, R1p, R2s, R2p, C1s, C1p, C2s, and C2p, the processor applies an input power PiNp at the input 306 of the match network model 302 and forward propagates the input power PiNp via the circuit elements of the match network model 302 to calculate a predicted output power PoNp at the output 304 of the match network model 302. For example, when the match network model 302 includes the series combination of the circuit elements R1s, C1s, L1s, and C11, an amount of current is propagated via the series combination to determine the power PRs consumed by the resistor R1s, the power PCs consumed by the capacitor C1s, the power PLs consumed by the inductor Ls, and the power PC1s consumed by the capacitor C11. The processor calculates a directional sum of the input power PiNp, the power PRs, the power PCs, the power PLs, and the power PC1s to compute the predicted output power PoNp. In some embodiments, the input power PiNp is the same as the power PoNm. In various embodiments, the input power PiNp is a randomly selected by the processor of the host computer system 112. In some embodiments, instead of the power PiNp, the value Pi1p is used. In various embodiments, the input power PiNp is received from the user via the input device connected to the processor.

The processor calculates a predicted efficiency ∈Np of the match network model 302 as a ratio of the predicted output power PoNp and the input power PiNp. The processor applies the method 800 for determining whether to change one or more of the parameters L1s, L1p, L2s, L2p, R1s, R1p, R2s, R2p, C1s, C1p, C2s, and C2p of the match network model 302. For example, in an operation 802, the processor determines whether the predicted efficiency ∈1p is within the pre-determined limit of the measured efficiency ∈1m and whether the predicted efficiency ∈Np is within the pre-determined limit of the measured efficiency ∈Nm. Upon determining that the predicted efficiency ∈1p is within the pre-determined limit of the measured efficiency ∈1m and that the predicted efficiency ∈Np is within the pre-determined limit of the measured efficiency ∈Nm, the processor assigns, in the operation 310, the parameters L1s, L1p, L2s, L2p, R1s, R1p, R2s, R2p, C1s, C1p, C2s, and C2p to the match network model 302 for use with the impedance matching network 1. On the other hand, upon determining that the predicted efficiency ∈1p is not within the pre-determined limit of the measured efficiency ∈1m or the predicted efficiency ∈Np is not within the pre-determined limit of the measured efficiency ∈Nm, the processor changes, in the operation 312, one or more of the parameters L1s, L1p, L2s, L2p, R1s, R1p, R2s, R2p, C1s, C1p, C2s, and C2p to generate the one or more changed parameters.

The processor repeats the operation 802 using the one or more changed parameters to determine whether the predicted efficiency ∈1p for the changed parameters is within the pre-determined limit from the measured efficiency ∈1m and whether the predicted efficiency ∈Np for the changed parameters is within the pre-determined limit from the measured efficiency ∈Nm. In this manner, the processor repeats the operation 802 until the predicted efficiency ∈1p is within the pre-determined limit from the measured efficiency ∈1m and the predicted efficiency ∈Np for the changed parameters is within the pre-determined limit from the measured efficiency ∈Nm to find one or more values of the one or more corresponding changed parameters for the match network model 302. The one or more values of the one or more corresponding changed parameters are then assigned to the match network model 302. For example, the processor maps the one or more changed parameters to the identification number of the impedance matching network 1, and stores the mapping, the identification number, and the one or more changed parameters in the memory device of the host computer system 112.

In some embodiments, instead of or in addition to changing one or more of the fixed parameters, L1s, L1p, L2s, L2p, R1s, R1p, R2s, R2p, C1s, C1p, C2s, and C2p, the processor, in the operation 312 of the method 800, changes the capacitance C11 in the same manner as that described above.

In various embodiments, upon determining that the predicted efficiency ∈1p is not within the pre-determined limit of the measured efficiency ∈1m and the predicted efficiency ∈Np is not within the pre-determined limit of the measured efficiency ∈Nm, the processor changes, in the operation 312, one or more of the fixed parameters L1s, L1p, L2s, L2p, R1s, R1p, R2s, R2p, C1s, C1p, C2s, and C2p to generate the one or more changed parameters.

Figure 9:
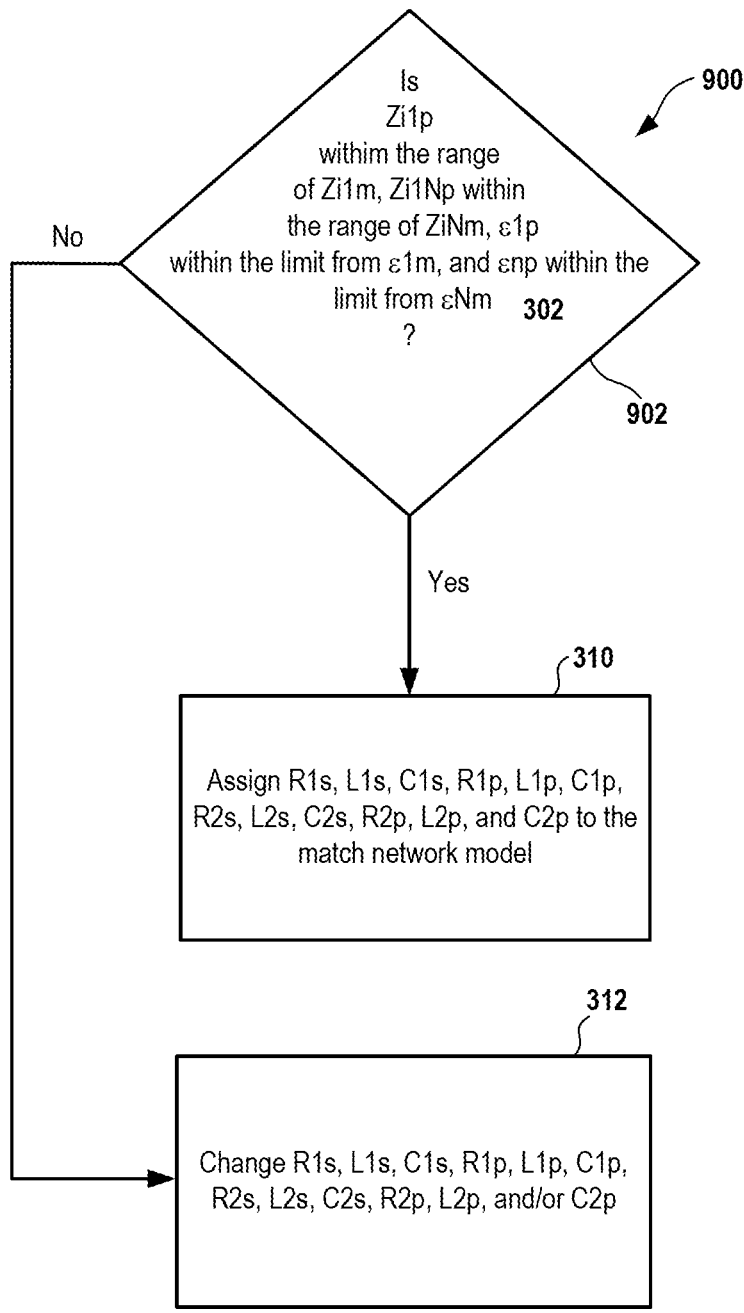
FIG. 9 is a flowchart of an embodiment of a method to determine the fixed parameters by using impedances and efficiencies.

FIG. 9 is a flowchart of an embodiment of a method 900 to determine the parameters, L1s, L1p, L2s, L2p, R1s, R1p, R2s, R2p, C1s, C1p, C2s, and C2p using the impedances Zi1p, Zi1m, ZiNp, ZiNm, the efficiencies ∈1m and ∈1p, and the efficiencies ∈Nm and ∈Np. The method 900 is executed by the processor of the host computer system 112. In an operation 902 of the method 900, it is determined by the processor whether the predicted input impedance Zi1p is within the pre-determined range of the input impedance Zi1m, whether the predicted input impedance ZiNp is within the pre-determined range of the input impedance ZiNm, whether the predicted efficiency ∈1p is within the pre-determined limit from the measured efficiency ∈1m, and whether the predicted efficiency ∈Np is within the pre-determined limit from the measured efficiency ∈Nm.

Upon determining that the predicted input impedance Zi1p is within the pre-determined range of the input impedance Zi1m, the predicted input impedance ZiNp is within the pre-determined range of the input impedance ZiNm, the predicted efficiency ∈1p is within the pre-determined limit from the measured efficiency ∈1m, and the predicted efficiency ∈Np is within the pre-determined limit from the measured efficiency ∈Nm, the operation 310 is performed by the processor. On the other hand, upon determining that the predicted input impedance Zi1p is not within the pre-determined range of the input impedance Zi1m, or the predicted input impedance ZiNp is not within the pre-determined range of the input impedance ZiNm, or the predicted efficiency ∈1p is not within the pre-determined limit from the measured efficiency ∈1m, or the predicted efficiency ∈Np is not within the pre-determined limit from the measured efficiency ∈Nm, the processor performs the operation 312.

In some embodiments, the processor performs the operation 312 upon determining that the predicted input impedance Zi1p is not within the pre-determined range of the input impedance Zi1m, or the predicted input impedance ZiNp is not within the pre-determined range of the input impedance ZiNm, or the predicted efficiency ∈1p is not within the pre-determined limit from the measured efficiency ∈1m, or the predicted efficiency ∈Np is not within the pre-determined limit from the measured efficiency ∈Nm, or a combination of two or more thereof. For example, the processor performs the operation 312 upon determining that the predicted input impedance Zi1p is not within the pre-determined range of the input impedance Zi1m, the predicted input impedance ZiNp is not within the pre-determined range of the input impedance ZiNm, the predicted efficiency ∈1p is not within the pre-determined limit from the measured efficiency ∈1m, and the predicted efficiency ∈Np is not within the pre-determined limit from the measured efficiency ∈Nm. As another example, the processor performs the operation 312 upon determining that the predicted input impedance ZiNp is not within the pre-determined range of the input impedance ZiNm and the predicted efficiency ∈Np is not within the pre-determined limit from the measured efficiency ∈Nm.

The processor repeats the operation 902 using the one or more changed parameters to determine whether the predicted input impedance Zi1p is within the pre-determined range of the input impedance Zi1m, whether the predicted input impedance ZiNp is within the pre-determined range of the input impedance ZiNm, whether the predicted efficiency ∈1p is within the pre-determined limit from the measured efficiency ∈1m, and whether the predicted efficiency ∈Np is within the pre-determined limit from the measured efficiency ∈Nm. In this manner, the processor repeats the operation 902 until the predicted input impedance Zi1p is within the pre-determined range of the input impedance Zi1m, the predicted input impedance ZiNp is within the pre-determined range of the input impedance ZiNm, the predicted efficiency ∈1p is within the pre-determined limit from the measured efficiency ∈1m, and the predicted efficiency ∈Np is within the pre-determined limit from the measured efficiency ∈Nm to find one or more values of the corresponding one or more changed parameters of the match network model 302. The values of the one or more changed parameters are then assigned to the match network model 302. For example, the processor maps the one or more changed parameters to the identification number of the impedance matching network 1, and stores the mapping, the one or more changed parameters, and the identification to in the memory device of the host computer system 112.

In some embodiments, instead of or in addition to changing one or more of the fixed parameters, L1s, L1p, L2s, L2p, R1s, R1p, R2s, R2p, C1s, C1p, C2s, and C2p, the processor, in the operation 312 of the method 900, changes the capacitance C11 in the same manner as that described above.

Figure 10:
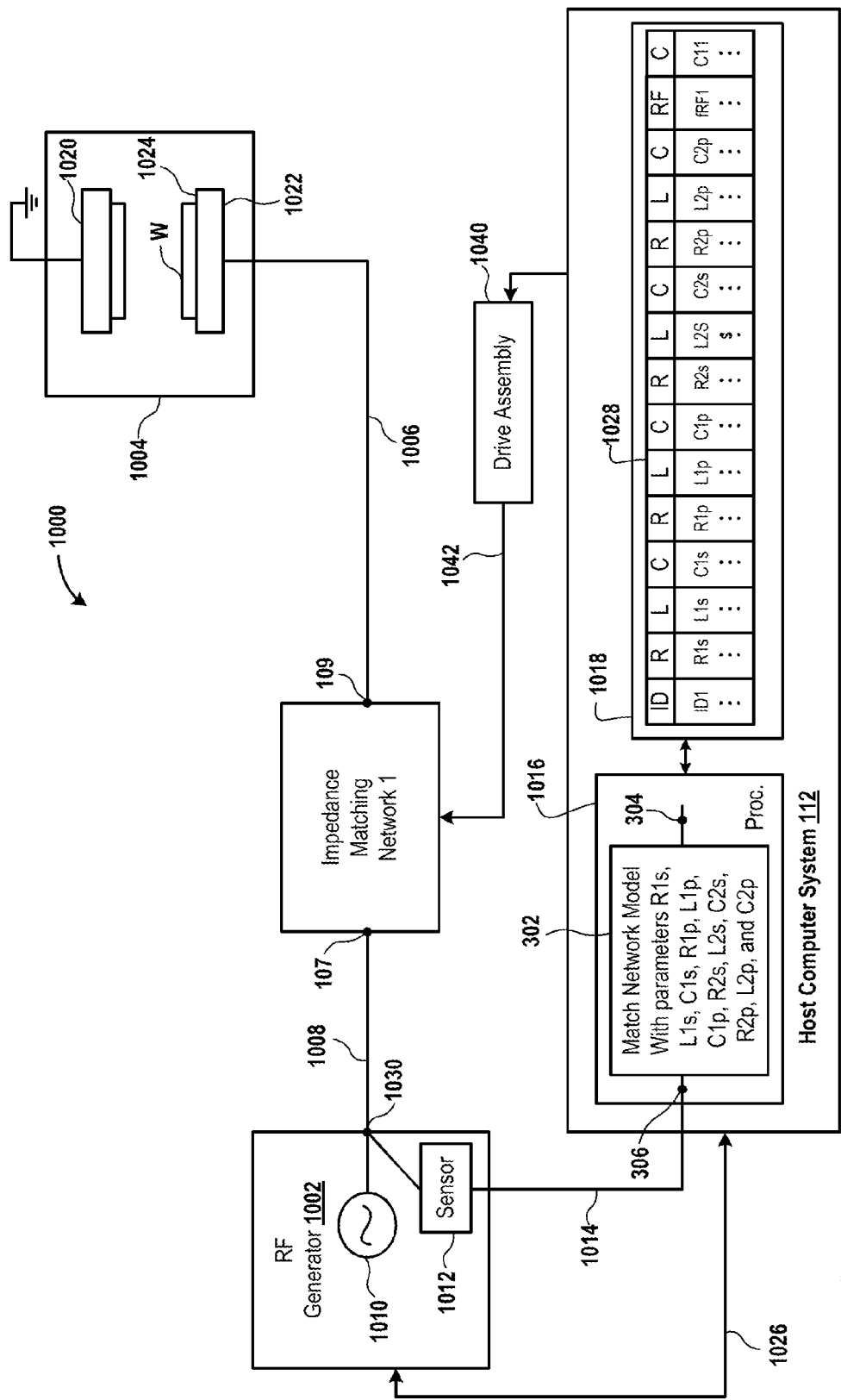
FIG. 10 is a diagram of an embodiment of a plasma system to illustrate use of the match network model within the plasma system.

FIG. 10 is a diagram of an embodiment of a plasma system 1000 to illustrate use of the match network model 302 within the plasma system 1000. The plasma system 1000 includes an RF generator 1002, the impedance matching network 1, a plasma chamber 1004, and the host computer system 112. The RF generator 1002 is the x MHz RF generator, or the y MHz RF generator, or the z MHz RF generator. The RF generator 1002 is operated at a frequency fRF1. The plasma chamber 1004 is connected to the output 109 of the impedance matching network 1 via an RF transmission line 1006 and the input 107 of the branch circuit of the impedance matching network 1 is connected to the RF generator 1002 via an RF cable 1008.

The RF generator 1002 includes an RF power supply 1010 and a sensor 1012, e.g., a complex voltage and current sensor, a complex impedance sensor, a complex voltage sensor, a complex current sensor, etc. The sensor 1012 is connected to the host computer system 112 via a network cable 1014, e.g., a serial transfer cable, a parallel transfer cable, a USB cable, etc. Examples of the sensor 1012 include a voltage sensor, a current sensor, an impedance sensor, a complex voltage and current sensor, a power sensor, etc. The host computer system 112 includes a processor 1016 and a memory device 1018, which stores the match network model 302 for access by the processor 1016.

The plasma chamber 1004 includes an upper electrode 1020, a chuck 1022, and a wafer W. The upper electrode 1020 faces the chuck 1022 and is grounded, e.g., coupled to a reference voltage, coupled to zero voltage, coupled to a negative voltage, etc. Examples of the chuck 1022 include an electrostatic chuck (ESC) and a magnetic chuck. A lower electrode of the chuck 1022 is made of a metal, e.g., anodized aluminum, alloy of aluminum, etc. Also, the upper electrode 1020 is made of a metal, e.g., aluminum, alloy of aluminum, etc. The upper electrode 1020 is located opposite to and facing the lower electrode of the chuck 1022.

In some embodiments, the plasma chamber 1004 is formed using additional parts, e.g., upper electrode extension that surrounds the upper electrode 1020, a lower electrode extension that surrounds the lower electrode of the chuck 1022, a dielectric ring between the upper electrode 1020 and the upper electrode extension, a dielectric ring between the lower electrode and the lower electrode extension, confinement rings located at edges of the upper electrode 1020 and the chuck 1022 to surround a region within the plasma chamber 1004 in which plasma is formed, etc.

The wafer W is placed on a top surface 1024 of the chuck 1022 for processing, e.g., depositing materials on the wafer W, or cleaning the wafer W, or etching layers deposited on the wafer W, or doping the wafer W, or implantation of ions on the wafer W, or creating a photolithographic pattern on the wafer W, or etching the wafer W, or sputtering the wafer W, or a combination thereof.

The processor 1016 of the host computer system 112 accesses a recipe, e.g., the frequency fRF1 of an RF signal to be generated by the RF generator 1002, an amount of power of the RF signal to be generated by the RF generator 1002, etc., from the memory device 1018 of the host computer system 112, and provides the recipe via a network cable 1026 to the RF generator 1002.

The recipe also includes a combined variable capacitance of the impedance matching network 1 to be achieved. The processor is connected to a drive assembly 1040, which is connected via a connection mechanism 1042 to the one or more variable capacitors of the impedance matching network 1. Examples of the drive assembly 1040 include one or more drivers, e.g., one or more transistors, etc., which are connected to respective one or more motors. The one or more motors are connected to respective one or more rods of the connection mechanism 1042. The processor 1016 controls the drive assembly 1040 to control the one or more variable capacitors of the impedance matching network 1 via the connection mechanism 1042 to achieve the corresponding one or more capacitance values to further achieve the combined variable capacitance. For example, the processor 1016 sends a signal to one of the one or more drivers that is connected to one of the one or more motors. Upon receiving the signal, the driver generates a current signal that is provided to a stator of the motor. A rotor in communication with the stator rotates to rotate one or more rods of the connection mechanism 1042 connected to the rotor. The rotation of the one or more rods changes a position of a plate of one of the one or more variable capacitors of the impedance matching network 1 to change a combined variable capacitance of the impedance matching network 1. Similarly, other ones of the one or more variable capacitors of the impedance matching network 1 are controlled by the processor 1016 to achieve the combined variable capacitance. The combined capacitance of all the variable capacitors of the impedance matching network 1 to be achieved is represented as the combined variable capacitance C11.

The RF generator 1002 receives the recipe and generates the RF signal having the frequency fRF1 and power within the recipe. The branch circuit of the impedance matching network 1 having the combined variable capacitance C11 receives the RF signal having the frequency fRF1 from the RF generator 1002 via the output 1030, the RF cable 1008, and the input 107 of the impedance matching network 1 and matches an impedance of a load connected to the output 109 of the impedance matching network 1 with that of a source connected to the input 107 of the impedance matching network 1 to generate a modified RF signal. Examples of the source include the RF generator 1002 and the RF cable 1008 that couples the RF generator 1002 to the impedance matching network 1. Examples of the load include the RF transmission line 1006 and the plasma chamber 1004. The RF transmission line 1006 connects the lower electrode of the chuck 1022 to the impedance matching network 1. The modified RF signal is provided by the impedance matching network 1 via the output 109 and the RF transmission line 1006 to the chuck 1022.

The chuck 1022 receives the modified RF signal and upon entry of a process gas within the plasma chamber 1004, plasma is stricken or maintained within the plasma chamber 1004. Examples of the process gas include an oxygen-containing gas or a fluorine-containing gas, etc. and the process gas is provided within the gap between the upper electrode 1020 and the chuck 1022. The plasma is used to process the wafer W.

The match network model 302 is stored in the memory device 1018 of the host computer system 112. Moreover, the memory device 1018 stores a database 1028 that includes an association between an identification of an impedance matching network 1, values of the parameters of the match network model 302, the frequency fRF1 of the RF signal generated by the RF generator 1002, and the combined variable capacitance C11 of the impedance matching network 1. For example, the database 1028 stores the identification number, e.g., ID1, etc., of the impedance matching network 1, and a mapping between the ID1 and the fixed parameters L1s, L1p, L2s, L2p, R1s, R1p, R2s, R2p, C1s, C1p, C2s, and C2p or the one or more changed parameters, that are determined using the method 303 (FIG. 3) or the method 500 (FIG. 5) or the method 600 (FIG. 6) or the method 800 (FIG. 8) or the method 900 (FIG. 9). Examples of an identification of an impedance matching network include a serial number of the impedance matching network. Moreover, in this example, the memory device 1018 stores an ID2 of another impedance matching network 2, and a mapping between the ID2 and the parameters of the impedance matching network 2. The parameters of the impedance matching network 2 are determined in a similar manner as that of determining the parameters of the impedance matching network 1 illustrated above using FIG. 3, 5, 6, 8, or 9.

In some embodiments, the fixed parameters of the impedance matching network 2 are the same as that of the fixed parameters of the impedance matching network 1. For example, the fixed parameters of the impedance matching network 2 are L1s, L1p, L2s, L2p, R1s, R1p, R2s, R2p, C1s, C1p, C2s, and C2p or the one or more changed parameters.

In various embodiments, the parameters of the impedance matching network 2 are the same as that of the parameters of the impedance matching network 1. For example, the parameters of the impedance matching network 2 are L1s, L1p, L2s, L2p, R1s, R1p, R2s, R2p, C1s, C1p, C2s, C2p, and C11, or the one or more changed parameters.

The impedance matching network 1 is assigned a serial number different from a serial number assigned to the impedance matching network 2 and both the impedance matching networks 1 and 2 have the same model number. In some embodiments, a serial number is on a housing of an impedance matching network and so is a model number. In various embodiments, an identification number includes letters, numbers, symbols, or a combination of two or more of letters, numbers, and symbols.

The processor 1016 of the host computer system 112 receives an indication from a user via the input device, e.g., a stylus, a touchpad, a touchscreen, a button, a mouse, etc., that is connected to the host computer system 112 that the RF generator 1002 is connected to the impedance matching network 1 having the ID1. The processor 1016 identifies from the memory device 1018 that the ID1 of the impedance matching network 1 is associated with the parameters L1s, L1p, L2s, L2p, R1s, R1p, R2s, R2p, C1s, C1p, C2s, and C2p or the one or more changed parameters of the match network model 302. The processor 1016 accesses, e.g., reads, etc., the parameters L1s, L1p, L2s, L2p, R1s, R1p, R2s, R2p, C1s, C1p, C2s, and C2p from the memory device 1018 and adjusts the parameters of the match network model 302 to have values L1s, L1p, L2s, L2p, R1s, R1p, R2s, R2p, C1s, C1p, C2s, and C2p or to have the one or more changed parameters associated with the impedance matching network 1.

The sensor 1012 is connected to the output 1030 to measure a variable at the output 1030. For example, the sensor 1012 measures an amount of impedance at the output 1030, or a complex voltage and current of the RF signal supplied by the RF generator 1002, or a complex voltage and current of an RF signal delivered by the RF generator 1002. In some embodiments, an RF signal delivered by the RF generator 1002 is a difference between an RF signal supplied by the RF generator 1002 to the impedance matching network 1 via the RF cable 1008 and an RF signal that is reflected back towards the RF generator 1002 from the plasma chamber 1004 via the impedance matching network 1.

When a measured variable, e.g., a complex voltage, a complex current, a complex impedance, a complex power, a complex voltage and current, etc., is received by the processor 1016 via the network cable 1014 from the sensor 1012, the processor 1016 applies the measured variable to the input 306 of the match network model 302, which is initialized to have the one or more parameters associated with the ID1 or the one or more changed parameters associated with the ID1, to generate a predicted variable at the output 304 of the match network model 302. The measured variable is forward propagated by the processor 1016 via the match network model 302 from the input 306 to the output 304 to generate an output variable at the output 304 of the match network model 302. For example, the processor 416 calculates a directional sum of a complex voltage received at the input 306 of the match network model 302, a complex voltage across a resistive element having the resistance R1s within the match network model 302, a complex voltage across an inductive element having the inductance L1s within the match network model 302, a complex voltage across a capacitive element having the fixed capacitance C1s, a complex voltage across a resistive element having the resistance R2s within the match network model 302, a complex voltage across an inductive element having the inductance L2s within the match network model 302, a complex voltage across a capacitive element having the fixed capacitance C2s, and a complex voltage across a capacitive element having the variable capacitance C11 within the match network model 302.

It should be noted that the complex voltages received at the input of the match network model 302, across the resistive element having the resistance R1s within the match network model 302, across the inductive element having the inductance L1s within the match network model 302, across the capacitive element having the fixed capacitance C1s, across the resistive element having the resistance R2s within the match network model 302, across the inductive element having the inductance L2s within the match network model 302, across the capacitive element having the fixed capacitance C2s, and across the capacitive element having the variable capacitance C11 within the match network model 302 have a frequency of fRF1 to generate a complex value at the output 304 of the match network model 302. In this example, the match network model 302 does not includes any other circuit elements other than the resistor R1s, the inductor L1s, the capacitor C1s, the resistor R2s, the inductor L2s, the capacitor C2s, and the capacitor C11, all of which are connected in series with each other. The complex voltage received at the input 306 of the match network model 302 is measured by the sensor 1012 connected to the output 1030 of the RF generator 1002 and is received from the sensor 1012 by the processor 1016. As such, there is no need to use a sensor, e.g., a voltage sensor, a current sensor, a complex impedance sensor, a complex voltage and current sensor, etc., between the impedance matching network 1 and the plasma chamber 1004 to determine a value of the variable at the output 109 of the impedance matching network 1. Such sensors are expensive to use. Comparatively, the sensor 1012 is already a part of the RF generator 1002, and is ready to use.

In some embodiments, the fixed values L1$s$, L1$p$, L2$s$, L2$p$, R1$s$, R1$p$, R2$s$, R2$p$, C1$s$, C1$p$, C2$s$, and C2$p$ apply to all impedance matching networks of the same model. For example, the fixed values L1$s$, L1$p$, L2$s$, L2$p$, R1$s$, R1$p$, R2$s$, R2$p$, C1$s$, C1$p$, C2$s$, and C2$p$ are applied by the processor 1016 to calculate the variable at the output 304 of the match network model 302 based on a value of the parameter obtained from the sensor 1012 when impedance matching networks having different serial numbers but having the same model number are consecutively connected to the output 1030 of the RF generator 1002. As another example, the parameters, e.g., the fixed parameters L1$s$, L1$p$, L2$s$, L2$p$, R1$s$, R1$p$, R2$s$, R2$p$, C1$s$, C1$p$, C2$s$, and C2$p$, etc., apply to both the impedance matching networks 1 and 2. This saves time in initializing the match network model 302 when the impedance matching network 1 is replaced with the impedance matching network 2 or the impedance matching network 2 is replaced with the impedance matching network 1.

It should be noted that in some embodiments, the parameters L1$s$, L1$p$, L2$s$, L2$p$, R1$s$, R1$p$, R2$s$, R2$p$, C1$s$, C1$p$, C2$s$, and C2$p$ are fixed, e.g., not changed using the drive assembly 1040 and the connection mechanism 1042, etc., during processing of the wafer W.

Figure 11:
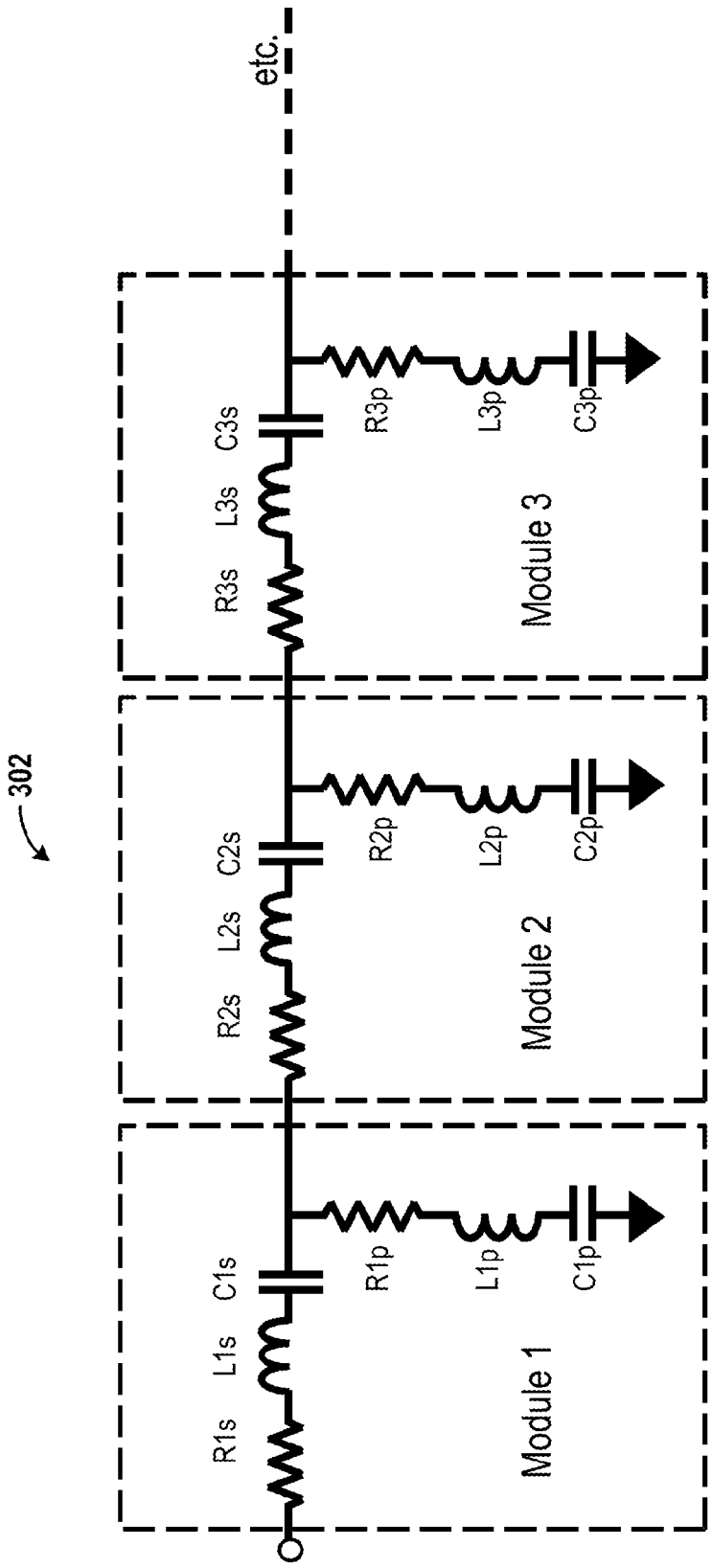
FIG. 11 is a block diagram of an embodiment of the match network model.

FIG. 11 is a block diagram of an embodiment of the match network model 302. A series circuit that includes the resistor R1$s$, the inductor L1$s$, and the capacitors C1$s$ is connected to a shunt circuit that includes the resistor R1$p$, the inductor L1$p$, and the capacitors C1$p$. Moreover, a series circuit that includes the resistor R2$s$, the inductor L2$s$, and the capacitors C2$s$ is connected to a shunt circuit that includes the resistor R2$p$, the inductor L2$p$, and the capacitors C2$p$. Also, a series circuit that includes the resistor R3$s$, the inductor L3$s$, and the capacitors C3$s$ is connected to a shunt circuit that includes the resistor R3$p$, the inductor L3$p$, and the capacitors C3$p$.

It should be noted that in some of the above-described embodiments, an RF signal is supplied to the lower electrode of the chuck 1022 and the upper electrode 1020 is grounded. In various embodiments, an RF signal is supplied to the upper electrode 1020 and the lower electrode of the chuck 1022 is grounded.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSP)s, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, the x MHz RF generator, the y MHz RF generator, and the z MHz RF generator are coupled to an inductor within the ICP plasma chamber. Examples of a shape of the inductor include a solenoid, a dome-shaped coil, a flat-shaped coil, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for assigning fixed parameters of a match network model by using a load impedance fixture, comprising:

measuring an efficiency of an impedance matching network to generate a measured efficiency, wherein said measuring the efficiency is performed using the load impedance fixture that is connected to the impedance matching network;

applying an input power at an input of the match network model to calculate a predicted output power at an output of the match network model when the match network model is assigned a fixed inductance, a fixed capacitance, and a fixed resistance;

calculating a predicted efficiency of the match network model from the predicted output power and the input power, wherein calculating the predicted efficiency of the match network model from the predicted output power and the input power is performed by computing a ratio of the predicted output power and the input power;

determining whether the predicted efficiency is within a predetermined limit from the measured efficiency;

assigning the fixed inductance, the fixed capacitance, and the fixed resistance to the match network model after determining that the predicted efficiency is within the predetermined limit from the measured efficiency; and modifying the fixed inductance, or the fixed capacitance, or the fixed resistance, or a combination of two or more thereof upon determining that the predicted efficiency is not within the predetermined limit from the measured efficiency.

2. The method of claim 1, wherein the measured efficiency is measured when the impedance matching network is connected to a network analyzer, wherein the network analyzer has an input port and an output port, wherein a combined impedance of the load impedance fixture and the input port of the network analyzer represents a plasma condition.

3. The method of claim 1, wherein the measured efficiency is measured when a first port of a network analyzer is connected to an input of the impedance matching network, the method further comprising:

receiving an S21 parameter from the network analyzer when a second port of the network analyzer is connected to an output of the load impedance fixture and when the load impedance fixture is connected to an output of the impedance matching network;

calculating a ratio of a square of the S21 parameter and a difference between one and a square of an S11 parameter to determine the measured efficiency.

4. The method of claim 1, wherein the measured efficiency is calculated when the impedance matching network is controlled to have a pre-determined combined variable capacitance and a network analyzer is operated at a pre-determined radio frequency, wherein the network analyzer is connected to an input of the impedance matching network.

5. The method of claim 1, further comprising:
associating the fixed inductance, or the fixed capacitance, or the fixed resistance, or the combination of two or more thereof with an identity of the impedance matching network;
storing the association between the fixed inductance, or the fixed capacitance, or the fixed resistance, or the combination of two or more thereof and the identity in a memory device;
receiving the identity of the impedance matching network; and
initializing the match network model to have the fixed inductance, or the fixed capacitance, or the fixed resistance, or the combination of two or more thereof upon receiving the identity.

6. The method of claim 1, wherein the measured efficiency is measured when a network analyzer is connected to an input of the impedance matching network and an output of the impedance matching network is connected to the load impedance fixture.

7. The method of claim 1, wherein applying the input power at the input of the match network model is performed when the match network model is initialized to have a combined capacitance value and a radio frequency (RF).

8. The method of claim 7, wherein the combined capacitance value is the same as that of the impedance matching network and the RF is the same as that of a network analyzer used to measure the measured efficiency.

9. The method of claim 1, wherein the fixed inductance, the fixed capacitance, and the fixed resistance do not change during processing of a substrate.

10. A system for assigning fixed parameters of a match network model by using a load impedance fixture, comprising:
a processor configured to receive an input power,
wherein the processor is configured to apply the input power at an input of a match network model to calculate a predicted output power at an output of the match network model when the match network model is assigned a fixed inductance, a fixed capacitance, and a fixed resistance,
wherein the processor is configured to calculate a predicted efficiency of the match network model from the predicted output power and the input power, wherein to calculate the predicted efficiency of the match network model from the predicted output power and the input power, the processor is configured to compute a ratio of the predicted output power and the input power,
wherein the processor is configured to determine whether the predicted efficiency is within a predetermined limit from a measured efficiency, wherein the measured efficiency is measured using a load impedance fixture that is connected to an impedance matching network,
wherein the processor is configured to assign the fixed inductance, the fixed capacitance, and the fixed resistance to the match network model after determining that the predicted efficiency is within the predetermined limit from the measured efficiency,
wherein the processor is configured to modify the fixed inductance, or the fixed capacitance, or the fixed resistance, or a combination of two or more thereof upon determining that the predicted efficiency is not within the predetermined limit from the measured efficiency; and
a memory device coupled to the processor, wherein the memory device is configured to store the match network model.

11. The system of claim 10, wherein the measured efficiency is measured using the impedance matching network that is connected to a network analyzer, wherein the network analyzer has an input port and an output port, wherein a combined impedance of the load impedance fixture and the input port of the network analyzer represents a plasma condition.

12. The system of claim 10,
wherein the measured efficiency is measured when a first port of a network analyzer is connected to an input of the impedance matching network,
wherein the processor is configured to receive an S21 parameter from the network analyzer when a second port of the network analyzer is connected to an output of the load impedance fixture and when the load impedance fixture is connected to an output of the impedance matching network;
wherein the processor is configured to calculate a ratio of a square of the S21 parameter and a difference between one and a square of an S11 parameter to determine the measured efficiency.

13. The system of claim 10, wherein the measured efficiency is measured when the impedance matching network is controlled to have a pre-determined combined variable capacitance and a network analyzer is operated at a pre-determined radio frequency, wherein the network analyzer is connected to an input of the impedance matching network.

14. The system of claim 10,
wherein the processor is configured to associate the fixed inductance, or the fixed capacitance, or the fixed resistance, or a combination of two or more thereof with an identity of the impedance matching network,
wherein the processor is configured to store the association between the fixed inductance, or the fixed capacitance, or the fixed resistance, or the combination of two or more thereof and the identity in the memory device,
wherein the processor is configured to receive the identity of the impedance matching network, and
wherein the processor is configured to initialize the match network model to have the fixed inductance, or the fixed capacitance, or the fixed resistance, or the combination of two or more thereof upon receiving the identity.

15. A system for assigning fixed parameters of a match network model by using a load impedance fixture, comprising:
a radio frequency (RF) generator configured to generate an RF signal;
an impedance matching network having an input that is coupled to the RF generator;
a plasma chamber coupled to an output of the impedance matching network;
a host computer system coupled to the RF generator, wherein the host computer system includes a processor and a memory device, wherein the memory device is coupled to the processor,
wherein the processor is configured to receive an input power, wherein the processor is configured to apply the input power at an input of a match network model to calculate a predicted output power at an output of the match network model when the match network model is assigned a fixed inductance, a fixed capacitance, and a fixed resistance, wherein the processor is configured to calculate a predicted efficiency of the match network model from the predicted output power and the input power, wherein the processor is configured to calculate the predicted efficiency of the match network model from the predicted output power and the input power by computing a ratio of the predicted output power and the input power, wherein the processor is configured to determine whether the predicted efficiency is within a predetermined limit from a measured efficiency, wherein the measured efficiency is measured using the load impedance fixture that is connected to the impedance matching network, and wherein the processor is configured to assign the fixed inductance, the fixed capacitance, and the fixed resistance to the match network model after determining that the predicted efficiency is within the predetermined limit from the measured efficiency, wherein the processor is configured to modify the fixed inductance, or the fixed capacitance, or the fixed resistance, or a combination of two or more thereof upon determining that the predicted efficiency is not within the predetermined limit from the measured efficiency, and wherein the memory device is configured to store the match network model.

16. The system of claim 15, wherein the measured efficiency is measured using the impedance matching network that is connected to a network analyzer, wherein the network analyzer has an input port and an output port, wherein a combined impedance of the load impedance fixture and the input port of the network analyzer represents a plasma condition of the plasma chamber.

17. The system of claim 15,
wherein the measured efficiency is measured when a first port of a network analyzer is connected to the input of the impedance matching network,
wherein the processor is configured to receive an S21 parameter from the network analyzer when a second port of the network analyzer is connected to an output of the load impedance fixture and when the load impedance fixture is connected to the output of the impedance matching network;
wherein the processor is configured to calculate a ratio of a square of the S21 parameter and a difference between one and a square of an S11 parameter to determine the measured efficiency.

18. The system of claim 15, wherein the measured efficiency is calculated when the impedance matching network is controlled to have a pre-determined combined variable capacitance and a network analyzer coupled to the impedance matching network is operated at a pre-determined radio frequency.

* * * * *